(12) United States Patent
Wang et al.

(10) Patent No.: US 8,497,537 B2
(45) Date of Patent: Jul. 30, 2013

(54) SEMICONDUCTOR DEVICE WITH FERRO-ELECTRIC CAPACITOR

(75) Inventors: Wensheng Wang, Kawasaki (JP); Ko Nakamura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/128,088

(22) Filed: May 28, 2008

(65) Prior Publication Data

US 2008/0224195 A1   Sep. 18, 2008

Related U.S. Application Data

(63) Continuation of application No. PCT/JP2005/021854, filed on Nov. 29, 2005.

(51) Int. Cl.
*H01L 21/02* (2006.01)

(52) U.S. Cl.
USPC .... 257/295; 257/296; 257/310; 257/E21.009; 257/E21.021; 257/E21.04

(58) Field of Classification Search
USPC ......................................... 257/295–296, 310
See application file for complete search history.

(56) References Cited

U.S. PATENT DOCUMENTS

| | | | |
|---|---|---|---|
| 5,508,953 A | 4/1996 | Fukuda et al. | |
| 6,174,766 B1 | 1/2001 | Hayashi et al. | |
| 6,337,238 B1 | 1/2002 | Nakabayashi | |
| 6,611,014 B1* | 8/2003 | Kanaya et al. | 257/295 |
| 6,794,199 B2* | 9/2004 | Yoshikawa et al. | 438/3 |
| 6,933,549 B2* | 8/2005 | Hornik et al. | 257/295 |
| 7,361,599 B2* | 4/2008 | Moise et al. | 438/689 |
| 7,419,837 B2* | 9/2008 | Wang | 438/3 |
| 7,456,454 B2* | 11/2008 | Sashida | 257/295 |
| 7,518,173 B2* | 4/2009 | Hikosaka et al. | 257/295 |
| 2001/0055852 A1* | 12/2001 | Moise et al. | 438/396 |

(Continued)

FOREIGN PATENT DOCUMENTS

| | | |
|---|---|---|
| JP | 6-326270 | 11/1994 |
| JP | 10-173138 | 6/1998 |

(Continued)

OTHER PUBLICATIONS

International Search Report of PCT/JP2005/021854, date of mailing Jan. 17, 2006.

(Continued)

*Primary Examiner* — A. Sefer
(74) *Attorney, Agent, or Firm* — Fujitsu Patent Center

(57) ABSTRACT

A semiconductor device has a ferro-electric capacitor with small leak current and less process deterioration even upon miniaturization. The semiconductor device includes: a semiconductor element formed in a semiconductor substrate; lamination of an interlayer insulating film and a lower insulating shielding film having a hydrogen/moisture shielding function, the lamination being formed covering the semiconductor element; a conductive adhesion enhancing film formed above the lower insulating shielding film; and a ferro-electric capacitor including a lower electrode formed above the conductive adhesion enhancing film, a ferro-electric film formed on the lower electrode and being disposed within the lower electrode as viewed in plan, and an upper electrode formed on the ferro-electric film and being disposed within the ferro-electric film as viewed in plan, wherein the conductive adhesion enhancing film has a function of improving adhesion of the lower electrode and reducing leak current of the ferro-electric capacitor.

8 Claims, 16 Drawing Sheets

U.S. PATENT DOCUMENTS

| | | | |
|---|---|---|---|
| 2003/0058709 A1* | 3/2003 | Yoshikawa et al. | 365/200 |
| 2003/0098497 A1* | 5/2003 | Solayappan et al. | 257/629 |
| 2004/0094791 A1* | 5/2004 | Ito et al. | 257/310 |
| 2004/0113189 A1* | 6/2004 | Takamatsu et al. | 257/295 |
| 2004/0185579 A1 | 9/2004 | Fujiki | |
| 2005/0207202 A1 | 9/2005 | Kumura et al. | |
| 2005/0218443 A1 | 10/2005 | Tamura et al. | |
| 2005/0258497 A1* | 11/2005 | Yamazaki et al. | 257/379 |
| 2006/0040493 A1* | 2/2006 | Zhang et al. | 438/652 |
| 2006/0073614 A1* | 4/2006 | Hara | 438/3 |
| 2006/0134808 A1* | 6/2006 | Summerfelt et al. | 438/3 |
| 2006/0214208 A1* | 9/2006 | Wang | 257/295 |
| 2006/0220081 A1* | 10/2006 | Nagai et al. | 257/295 |
| 2006/0278954 A1* | 12/2006 | Izumi | 257/532 |
| 2008/0017902 A1* | 1/2008 | Wang | 257/295 |
| 2008/0073685 A1* | 3/2008 | Wang | 257/295 |
| 2008/0105911 A1* | 5/2008 | Wang | 257/295 |
| 2008/0111173 A1* | 5/2008 | Wang | 257/295 |
| 2008/0157155 A1* | 7/2008 | Wang | 257/295 |
| 2009/0280577 A1* | 11/2009 | Takamatsu et al. | 438/3 |

FOREIGN PATENT DOCUMENTS

| | | |
|---|---|---|
| JP | 11-008360 | 1/1999 |
| JP | 2003-197873 | 7/2003 |
| JP | 2003-197873 A | 7/2003 |
| JP | 2004-153019 A | 5/2004 |
| JP | 2004-193430 A | 7/2004 |
| JP | 2004-303996 A | 10/2004 |
| JP | 2004-320063 | 11/2004 |
| JP | 2005-044995 A | 2/2005 |
| JP | 2005-057087 A | 3/2005 |
| JP | 2005-268478 A | 9/2005 |
| JP | 2005-277315 A | 10/2005 |
| JP | 2005-311059 A | 11/2005 |
| WO | WO 2005/081317 * | 9/2005 |

OTHER PUBLICATIONS

Chinese Office Action dated Sep. 18, 2009, issued in corresponding Chinese Patent Application No. 200580052180.

"Japanese Office Action" mailed by JPO and corresponding to Japanese patent application No. 2007-547801 on Sep. 11, 2012, with English translation.

Japanese Office Action mailed Jun. 5, 2012 for corresponding Japanese Application No. 2007-547801, with Partial English-language Translation.

Partial English-language Translation of Japanese Office Action mailed Mar. 6, 2012 for corresponding Japanese Application No. 2007-547801.

Japanese Office Action mailed Mar. 26, 2013 for corresponding Japanese Application No. 2007-547801, with partial English-language translation.

USPTO, Non-Final Rejection, May 30, 2013, in U.S. Appl. No. 13/754,924 [Pending].

* cited by examiner

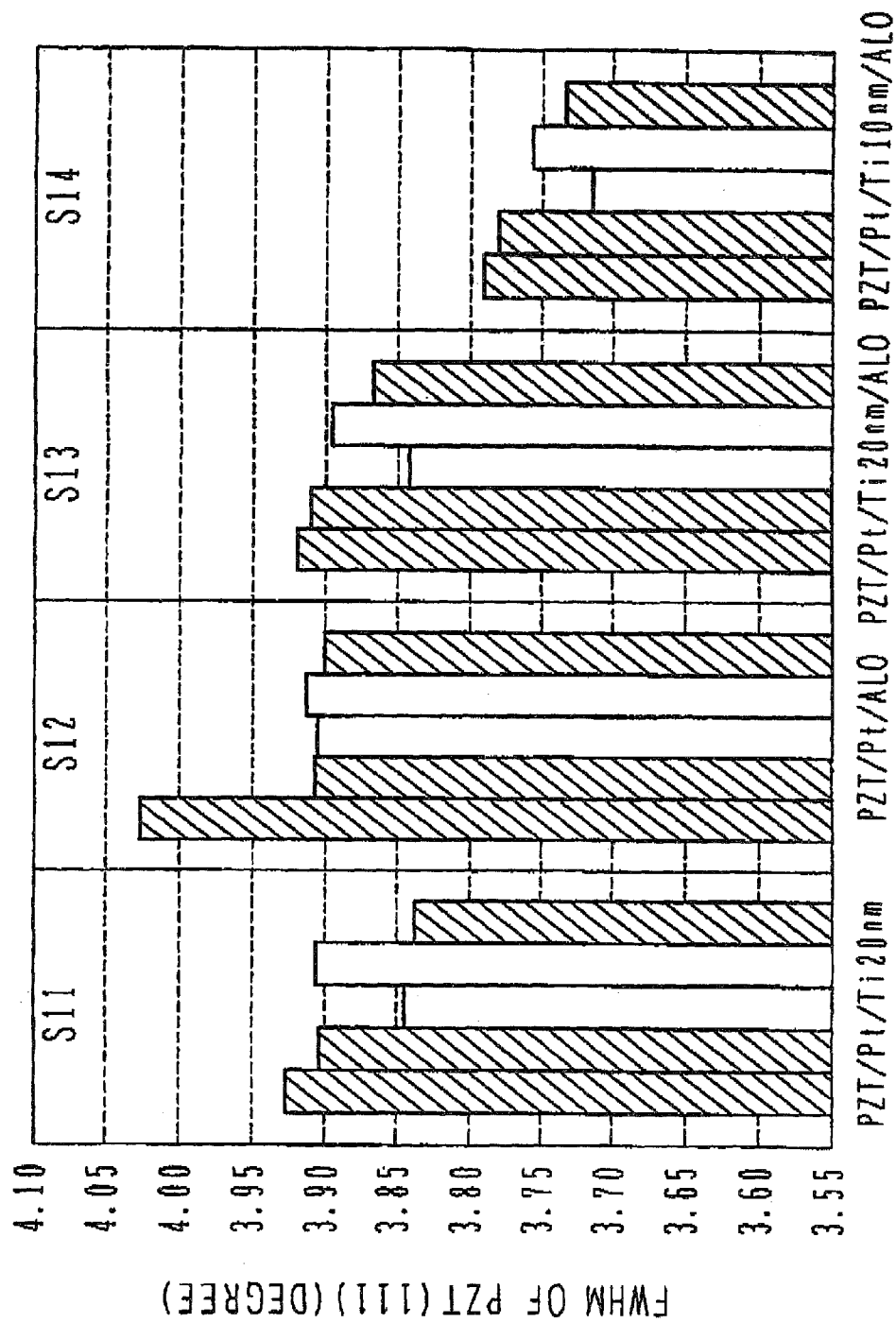

SEMICONDUCTOR DEVICE WITH FERRO-ELECTRIC CAPACITOR

This application is a continuation application of International Patent Application PCT/JP2005/21854, filed on Nov. 29, 2005, designating US as one of the designation countries, the entire contents of which are incorporated herein by reference.

TECHNICAL FIELD

The embodiments discussed herein are directed to a semiconductor device and a manufacture method thereof. The embodiments may relate to a semiconductor device having a ferro-electric capacitor and a manufacture method thereof.

BACKGROUND ART

With the recent advancement of digital technologies, there is a strong tendency toward high speed processing or storage of high capacity data, and a demand for high integration and high performance of semiconductor devices used in electronic apparatus. In order to realize high integration of a semiconductor device, as a capacitor dielectric film of a capacitor which forms a storage element, a high dielectric constant material film or a ferro-electric material film is being used in place of a conventional silicon oxide film or a silicon nitride film.

As a nonvolatile memory capable of high speed read/write at a low voltage, a ferro-electric random access memory (FeRAM) in particular has been studied and developed vigorously which uses a ferro-electric film having spontaneous polarization characteristics as a capacitor dielectric film.

A ferro-electric memory (FeRAM) is a nonvolatile memory in which stored information will not be erased even if a power supply is shut down, and is expected to realize high integration, high speed driving, high durability and low power consumption.

FeRAM stores information by utilizing hysteresis characteristics of ferro-electric material. A ferro-electric capacitor having a ferro-electric film as a capacitor dielectric film sandwiched between a pair of electrodes generates polarization corresponding to a voltage applied across the electrodes, and retains the polarization even after the applied voltage is removed. As the polarity of the applied voltage is reversed, the polarity of polarization is also reversed. By detecting this polarization, information can be read. As the material of a ferro-electric film, oxide ferro-electric material having the perovskite crystal structure is used mainly, such as $PZT(Pb(Zr_{1-x}Ti_x)O_3)$ and $SBT(SrBi_2Ta_2O_9)$ having a large polarization quantity, e.g., about 10 $\mu C/cm^2$ to 30 $\mu C/cm^2$. In order to form an oxide ferro-electric film having excellent characteristics, the film is required to be formed or to be subjected to heat treatment in an oxidizing atmosphere, and a lower electrode (also an upper electrode when necessary) is often made of noble metal hard to be oxidized, or noble metal maintaining conductivity even if it is oxidized or noble metal oxide.

Before a ferro-electric capacitor is formed, a MOS transistor is formed on a silicon substrate. When a ferroelectric capacitor is formed after the lower structure such as MOS transistors is formed, it is necessary that the oxidizing atmosphere during formation of a ferro-electric film should not adversely affect the lower structure. For example, after MOS transistors are formed, the MOS transistors are protected by a film such as a silicon oxynitride film having an oxygen shielding ability, and an interlayer insulating film is formed on the oxygen shielding film.

The interlayer insulating film of a semiconductor integrated circuit device is made of silicon oxide in many cases. Silicon oxide has high affinity with moisture. As moisture permeates from an external, moisture can reach wirings, capacitors, transistors and the like through the interlayer insulating film. As moisture reaches a capacitor particularly a ferro-electric capacitor, the characteristics of a dielectric film particularly a ferro-electric film are deteriorated. If the ferro-electric film is reduced by hydrogen derived from permeated moisture and oxygen defects are formed, crystallinity becomes bad. The characteristics are deteriorated such as a reduced residual polarization quantity and a lowered dielectric constant. Similar phenomena occur by long term use. As hydrogen permeates, deterioration of the characteristics becomes more direct than moisture. Silane used as silicon source for forming a silicon film or a silicon oxide film is silicon hydride, and generates a large amount of hydrogen when decomposed. Hydrogen is also a factor of deteriorating a ferro-electric film.

In a standard ferro-electric capacitor having a structure that a PZT ferro-electric film is sandwiched between lower and upper electrodes made of Pt, it is known that ferro-electricity of the PZT film is almost lost if the substrate is heated to about 200° C. in an atmosphere at a hydrogen partial pressure of 40 Pa (0.3 Torr).

It is also known that the ferro-electricity of the ferro-electric film is degraded considerably if heat treatment is performed on a ferro-electric capacitor in a state that hydrogen or moisture is absorbed in the capacitor or in a state that moisture exists near the capacitor.

In manufacture processes for FeRAM, processes after the ferro-electric film is formed are so selected that generation of moisture and hydrogen is as less as possible and the process temperature is low. For example, a silicon oxide film is formed by chemical vapor deposition (CVD) using tetra-ethoxysilane (TEOS) having a relatively small hydrogen generation amount, as Si source gas.

A process of forming a lower electrode just under the ferro-electric film is important in forming a ferro-electric capacitor. A conventional lower electrode has a structure that Ti and Pt are sequentially laminated on an insulating film. The Ti film improves adhesion between the insulating film and the lower electrode. If the Ti film is not used, there is a high possibility that the Pt electrode is stripped or peeled off. The Pt film is formed by sputtering. If this sputtering is performed at a high temperature, the Pt film reacts with the Ti film, and will not cause (1 1 1) orientation, resulting in a randomly oriented structure. If a $TiO_2$ film is used instead of the Ti film, reaction is suppressed so that the Pt film can be formed at a high temperature. However, as a $TiO_2$ film is formed on a degassed insulating film, crystallinity of the $TiO_2$ film is degraded, and crystallinity of the Pt film and ferro-electric film formed on the $TiO_2$ is lowered.

JP-A-2002-289793 (applicant: Fujitsu Limited), which is incorporated herein by reference, proposes to use a lamination structure of a $TiO_2$ film on an $SiO_2$ film, or an alumina film, as an insulating adhesion enhancing film under a Pt lower electrode.

JP-A-HEI-7-14993 (applicant: Mitsubishi Electric Corporation) proposes a DRAM semiconductor device using a high dielectric constant film such as $SrTiO_3$. It is pointed out that when a lower electrode of a flat plane shape is formed on an interlayer insulating film of silicon oxide formed with an Si via conductor connected to a transistor and a high dielectric constant film such as $SrTiO_3$ is formed on the interlayer insulating film, covering the lower electrode, the high dielectric constant film is likely to be peeled or stripped off from the interlayer insulating film, and proposes to form an insulating adhesion enhancing film between the interlayer insulating film and high dielectric constant film. The insulating adhesion enhancing film is made of $TiO_2$, $ZrO_2$, $Ta_2O_5$, $Si_3N_4$ or $Al_2O_3$. After the insulating adhesion enhancing film is formed on the whole surface of the interlayer insulating film, a polysilicon via conductor is formed, a Pt lower electrode film is formed on the insulating adhesion enhancing film, via a TiN barrier film which prevents silicide reaction, and patterned. Thereafter a high dielectric constant film is formed above the interlayer insulating film, covering the lower electrode, and an upper electrode layer common to a number of capacitors is formed on the high dielectric constant film.

JP-A-2005-39299 (applicant: Matsushita Electric Industrial Co. Ltd.) proposes, in a ferro-electric capacitor having a structure that a ferro-electric film covers a lower electrode formed on an interlayer insulating film and an upper electrode is formed on the ferro-electric film, to form a conductive hydrogen barrier film, covering the upper electrode and having an overhang portion extending over the interlayer insulating film. After an upper interlayer insulating film is formed covering the ferro-electric capacitor, a via hole is formed reaching the overhang portion of the conductive hydrogen barrier film, and a conductive plug is formed in the via hole. It teaches that it is preferable to use, as the conductive hydrogen barrier film, a Ti film, a Ta film, a TiON film, a TiN film, a TaN film, a TiAlN film, a TiAlON film or an alloy film containing these.

JP-A-2003-174146 (applicant: Fujitsu Limited), which is incorporated herein by reference, proposes to form an upper electrode with a lamination of two types of noble metal oxide films. Transistors formed on a semiconductor substrate are covered with an insulating barrier film having an oxygen shielding ability such as a silicon nitride film and an silicon oxynitride film in order to prevent an oxidizing atmosphere during formation of the ferro-electric film from adversely affecting the transistors. The ferro-electric capacitor is covered with an insulating barrier film having a hydrogen shielding ability such as alumina in order to prevent the characteristics of the ferro-electric capacitor from being degraded by heat treatment in a reducing atmosphere.

SUMMARY

It is an aspect of the embodiments discussed herein to provide a semiconductor device including: a semiconductor substrate; a semiconductor element formed in the semiconductor substrate; an insulating film covering the semiconductor element and formed above the semiconductor substrate; a lower insulating hydrogen diffusion preventive film having a hydrogen/moisture shielding function and formed above the insulating film; a conductive adhesion enhancing film formed above the lower insulating hydrogen diffusion preventive film; and a ferro-electric capacitor including a lower electrode formed above the conductive adhesion enhancing film, a ferro-electric film formed on the lower electrode and being disposed within the lower electrode as viewed in plan, and an upper electrode formed on the ferro-electric film and being disposed within the ferro-electric film as viewed in plan, wherein the conductive adhesion enhancing film has a function of improving adhesion of the lower electrode of the ferro-electric capacitor and reducing leak current of the ferro-electric capacitor.

BRIEF DESCRIPTION OF THE DRAWINGS

FIGS. 3A to 3L are cross sectional views and graphs explaining experiments made by the present inventor and the measurement results.

DETAILED DESCRIPTION OF THE EMBODIMENTS

High integration and low voltage operation are required recently also for FeRAM. It is necessary for high integration to reduce an area of a ferro-electric capacitor, and it is desired for low voltage operation to thin (reduce a thickness of) a ferro-electric film to raise an electric field intensity upon unit voltage application. There may arise a problem of whether the expected characteristics can be maintained even if the area of the ferro-electric film is reduced and a film thickness is thinned.

Prior to describing the embodiments of the present invention, experiments made by the present inventor will be described first. With reference to FIGS. 2A to 2D, description will be made on preliminary experiments observing what influence appears when a capacitor cell size is reduced.

Figure 2A:
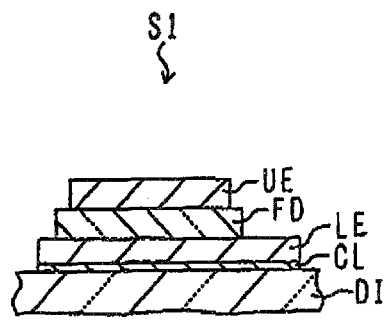
FIGS. 2A to 2D are cross sectional views, an equivalent circuit diagram, and a graph explaining preliminary experiments made by the present inventor and the measurement results.

FIG. 2A shows a sample S1 of a capacitor formed by laminating a Pt film on an insulating film, as a lower electrode LE via a Ti film interposed therebetween as an adhesion enhancing layer CL, laminating on the Pt film, a PZT film as a ferro-electric film FD and a Pt film as an upper electrode UE, and shaping into the capacitor of 50 μm×50 μm. Three types of ferro-electric films were formed, one having a thickness of 200 nm as conventional thickness, and two having thicknesses of 150 nm and 120 nm which are thinned more than the conventional one.

Figure 2B:
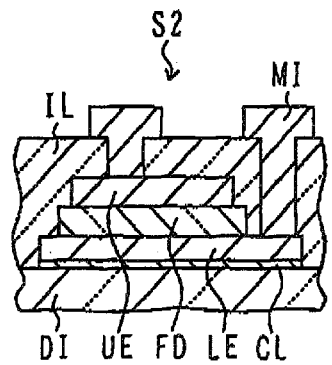

FIG. 2B shows a sample S2 formed by depositing an interlayer insulating film IL covering the sample S1 shown in FIG. 2A, forming contact holes and forming first metal wirings M1 connected to the upper electrode UE and lower electrode LE. As compared to the sample S1, processes are added for interlayer insulating film formation, contact hole formation and first metal wiring formation.

Figure 2C:
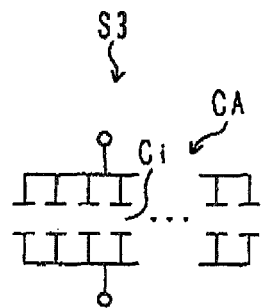

FIG. 2C shows an equivalent circuit of a sample S3 of a capacitor cell array CA connecting 1428 capacitors by first metal wirings, each capacitor Ci being a rectangle having a size of a longer side of 1.60 μm and a shorter side of 1.15 μm. The total area of the capacitor cell array CA is 2500 μm² same as that of the samples S1 and S2. The sample S3 corresponds to fine portions obtained by dividing the sample S2. As compared to the sample S2, processes are added for upper electrode etching and ferro-electric film etching.

It can be considered that influence caused by additional processes can be observed through comparison of the characteristics of the samples S1, S2 and S3. The samples S1, S2 and S3 were formed on the same wafer. Each of two wafers was formed with each 20 samples of S1, S2, and S3 and a switching charge quantity $Q_{SW}$ was measured.

Figure 2D:
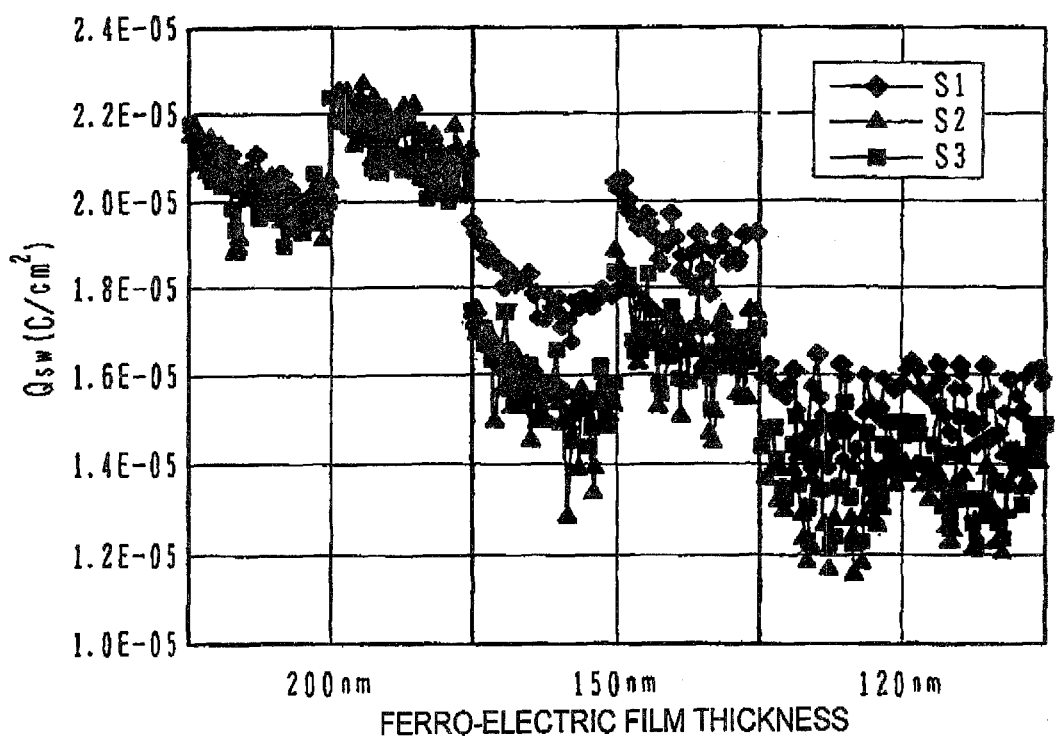

FIG. 2D is a graph showing measurement results. The abscissa shows three types of samples having different thicknesses of the ferro-electric film, and the ordinate represents a switching charge quantity $S_{SW}$ in the unit of C/cm². A measurement value of the sample S1 is indicated by a rhomb, a measurement value of the sample S2 is indicated by a triangle, and a measurement value of the sample S3 is indicated by a rectangle.

At the conventional thickness of 200 nm of the ferro-electric film, the samples S2 and S3 show similar values to those of the sample S1. It can be understood that the process deterioration is negligible. At the thinned thickness of 150 nm and 120 nm of the ferro-electric film, measurement values of the samples S2 and S3 become smaller than those of the sample S1, indicating occurrence of the process deterioration. As the thickness of the ferro-electric film becomes thin, the switching charge quantity $Q_{SW}$ itself reduces, and at the film thickness of 120 nm, this quantity shows a value practically unusable. These results suggest that high integration and low voltage operation cannot be realized if conventional technologies are adopted.

If the Pt lower electrode of the ferro-electric capacitor is formed directly on the insulating film, peel-off of the electrode occurs. It is said that an adhesion enhancing film should be formed between the insulating film and Pt lower electrode. In addition to a conductive Ti film as the adhesion enhancing film, there is a proposal to use an insulating alumina (AlO) film or a titanium oxide (TiO) film. An alumina film is used also as a hydrogen diffusion preventive film by covering a ferro-electric capacitor with the alumina film. It can be considered that the Ti film and alumina film have different functions. There is a possibility of new advantages if films having different functions are laminated. In this context, samples were formed including a sample formed with a Ti film under the Pt lower electrode, a sample formed with an alumina film under the Pt lower electrode, and a sample formed with an alumina film and a Ti film. First, a silicon oxide film having a thickness of about 100 nm was formed by thermally oxidizing a silicon substrate surface. On the thermal oxide film, a silicon oxide film was deposited to a thickness of about 800 nm by chemical vapor deposition (CVD) using TEOS as source gas. Thereafter, annealing was performed for 30 minutes at 650° C. in a nitrogen atmosphere to degas the silicon oxide film. These processes are common to respective samples. The silicon oxide film is denoted hereinafter as an insulating film INS.

Figure 3A:
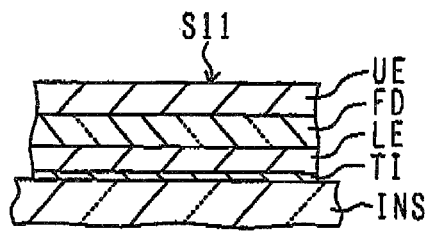

FIG. 3A shows the structure of a sample S11 formed by depositing a Ti film Ti to a thickness of about 20 nm on an insulating film INS, and forming a Pt lower electrode LE, a PZT ferro-electric film FD and a Pt upper electrode UE on the Ti film.

Figure 3B:
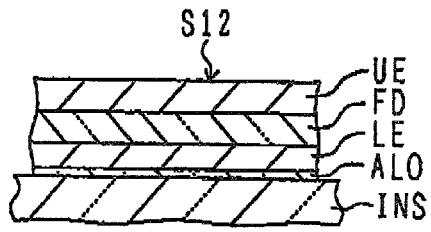

FIG. 3B shows the structure of a sample S12 formed by depositing an alumina film ALO to a thickness of about 20 nm on an insulating film INS, and forming a Pt lower electrode LE, a PZT ferro-electric film FD and a Pt upper electrode UE on the alumina film.

Figure 3C:
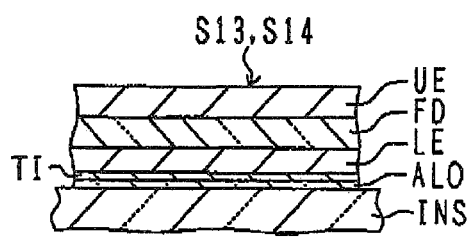

FIG. 3C shows the structure of samples S13 and S14 formed by depositing first an alumina film ALO to a thickness of about 20 nm on an insulating film INS, and forming a Ti film Ti having a thickness of about 20 nm and 10 nm respectively on the alumina film, and then forming a Pt lower electrode LE, a PZT ferro-electric film FD and a Pt upper electrode UE on the Ti film. Some measurements were conducted at the Intermediate stage of forming the samples.

Figure 3D:
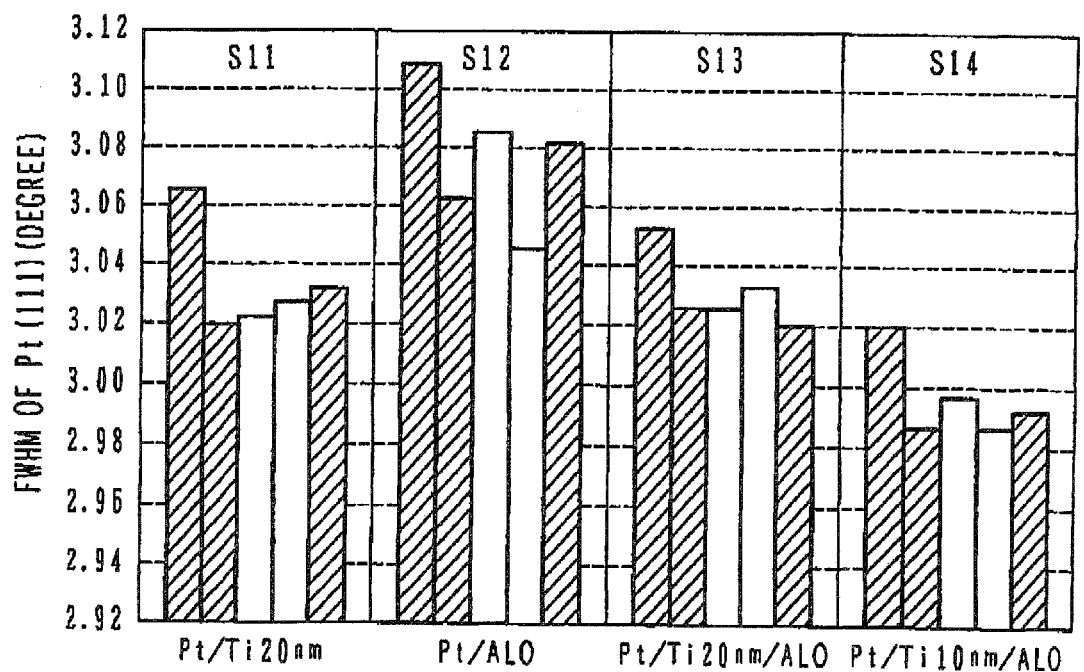

FIG. 3D is a graph showing values of the full width at half maximum (FWHM) of rocking curve of the Pt lower electrode LE of the (1 1 1) orientation measured by tetra-axis X-ray diffraction (XRD) after the Pt lower electrode LE is deposited to a thickness of 180 nm at a substrate temperature of 350° C. Measurements were conducted at five points, center, upper, lower, left and right of a wafer. The abscissa represents a measurement point, and the ordinate represents a full width at half maximum in the unit of degree. It indicates that the smaller the FWHM value, crystallinity is better. The sample S11 forming the Ti film of 20 nm thick under the Pt film cab be considered as a standard sample. A FWHM value of the standard product is about 3.0 degrees. Crystallinity is degraded for the sample S12 changing the Ti film to the alumina film under the Pt film. The sample S13 inserting further the alumina film under the Ti film has a FWHM value about the same as that of the standard sample, and influence of insertion of the alumina film upon crystallinity is scarcely observed. Crystallinity improves slightly for the sample which has a Ti film thinned to 10 nm.

PZT films having thicknesses of 150 nm and 120 nm were formed on the Pt lower electrodes LE by sputtering, and crystallized by rapid thermal annealing (RTA).

FIG. 3E is a graph showing FWHM values of the rocking curves of PZT film of 150 nm thick on the (1 1 1) orientation measured by tetra-axis XRD. Similar to FIG. 3D, the abscissa represents five measurement points, center, upper, lower and left and right of a wafer, and the ordinate represents a FWHM value. A FWHM value of the standard product is about 3.9 degrees. Influence upon (1 1 1) crystallinity is hardly observed for the sample S12 changing the Ti film to the alumina film and the sample S13 inserting the alumina film under the Ti film. (1 1 1) crystallinity of the PZT film is improved for the sample S14 thinning the Ti film to 10 nm and inserting the aluminum film under the Ti film. In terms of crystallinity of the PZT film, the best results are given by the sample inserting a two-layer structure of the Ti film laminated on the alumina film under the Pt lower electrode and thinning the Ti film.

Figure 3F:
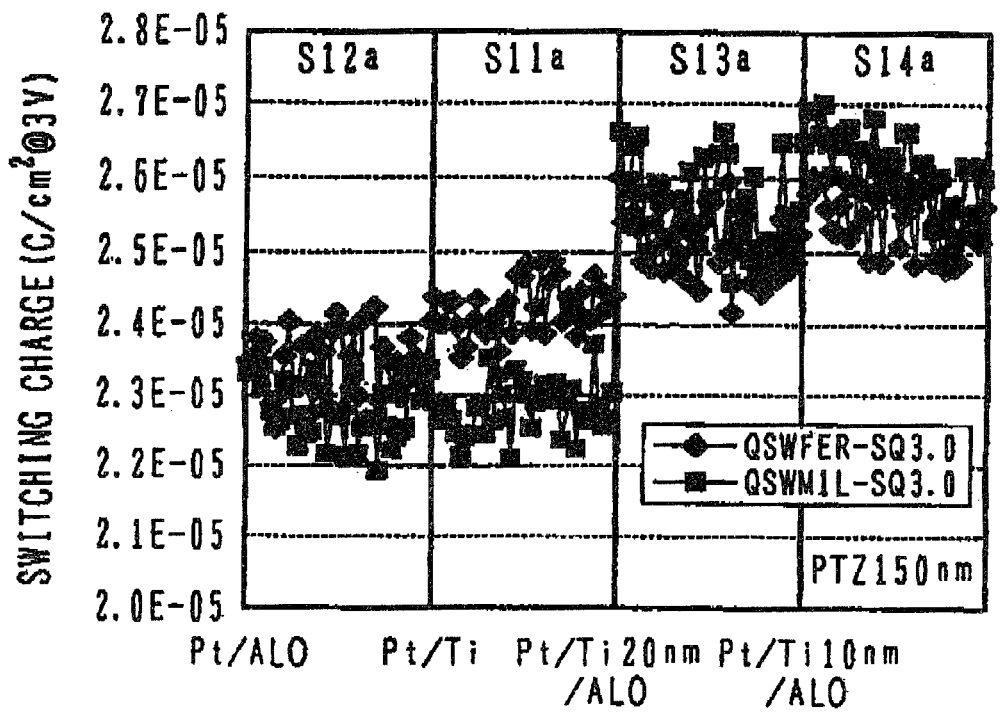
Figure 3G:
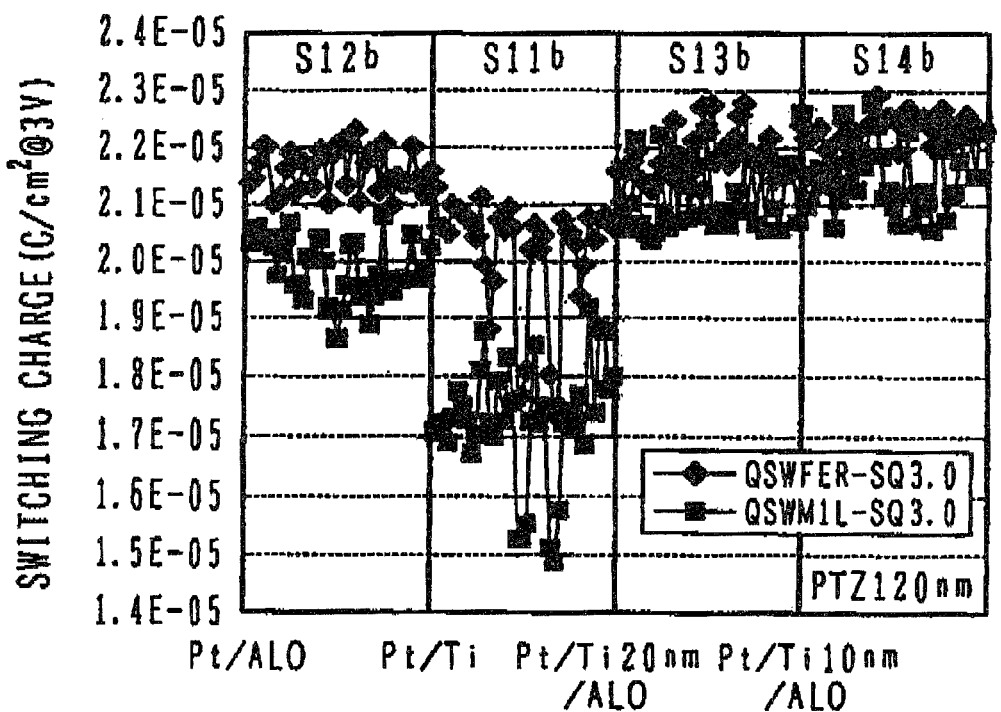

FIGS. 3F and 3G are graphs showing measurement results of the switching charge quantity upon application of 3V to capacitors having a plan shape of 50 μm×50 μm formed by forming a Pt upper electrode UE on PZT films having thicknesses of 150 nm and 120 nm and patterning the upper electrode and ferroelectric film. The abscissa indicates each sample, and the ordinate represents a switching charge quantity in the unit of C/cm². A measurement value in the state that the ferro-electric capacitor is formed is indicated by a rhomb, and a measurement value in the state that the interlayer insulating film is formed and the first metal wirings are formed is indicated by a rectangle.

As compared to a sample S12a forming a single layer alumina film under a Pt lower electrode and having a PZT film thickness of 150 nm, a sample S11a forming a single layer Ti film under a Pt lower electrode and having a PZT film thickness of 150 nm has a slightly higher switching charge quantity in the state of a capacitor, but reduces the switching charge quantity to almost the same as that of the sample S12a after the first metal wirings are formed. This suggests occurrence of the process deterioration. At the PZT film thickness of 120 nm, the process deterioration of a sample S11b having the Ti film increases considerably as compared to a sample S12b having the alumina film.

The samples S13 and S14 forming a lamination of the alumina film and a Ti film under the Pt lower electrode have a large switching charge quantity and the process deterioration is scarcely recognized. Although there is a possibility of influence of annealing used for wiring formation, an ability of providing a good switching charge quantity will not change. Good results are obtained even if the PZT film is thinned.

Figure 3H:
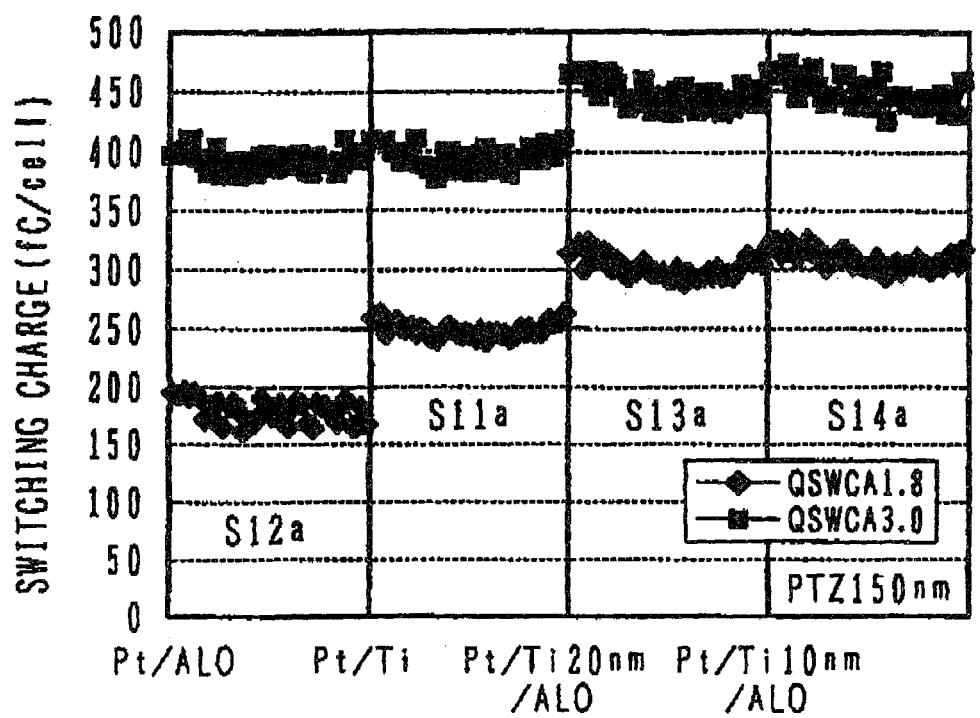
Figure 3I:
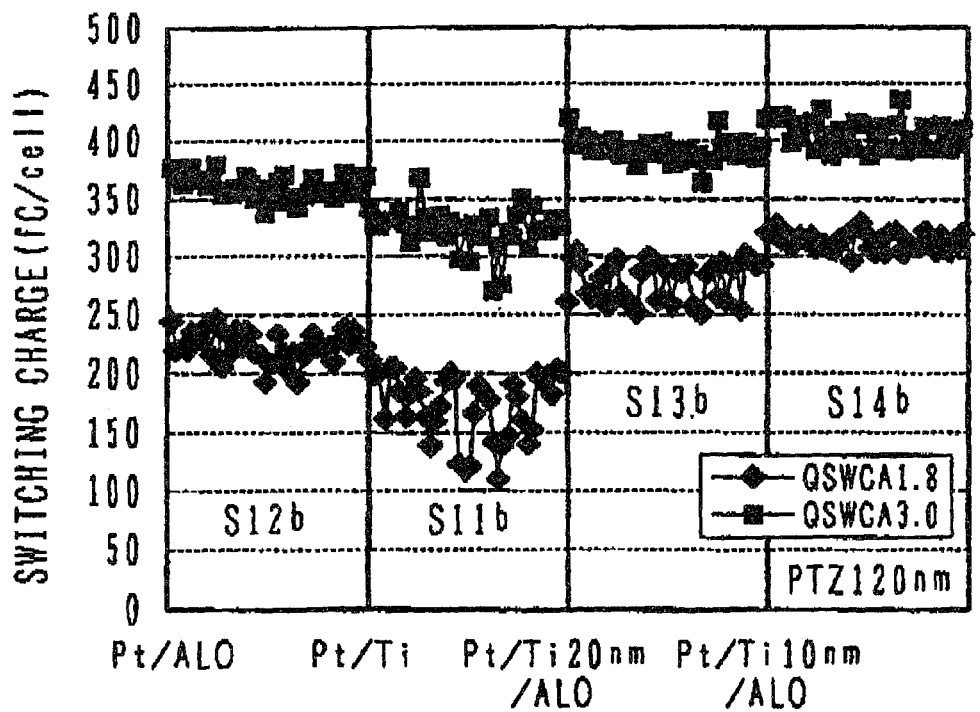

FIGS. 3H and 3I show measurement values of a switching charge quantity of a cell array having PZT film thicknesses of 150 nm and 120 nm. Wirings are required for the cell array, and components up to the first metal wirings are formed. Two values of voltages of 3 V and 1.8 V were applied. The samples S13 and S14 forming the lamination film have large switching charge quantity as a whole, and have large switching quantity particularly at an application voltage of 1.8 V. The sample S11 forming the single layer Ti film has a switching charge quantity greatly deteriorated for the thinned PZT film of 120 nm thick and an application voltage of 1.8 V.

Figure 3J:
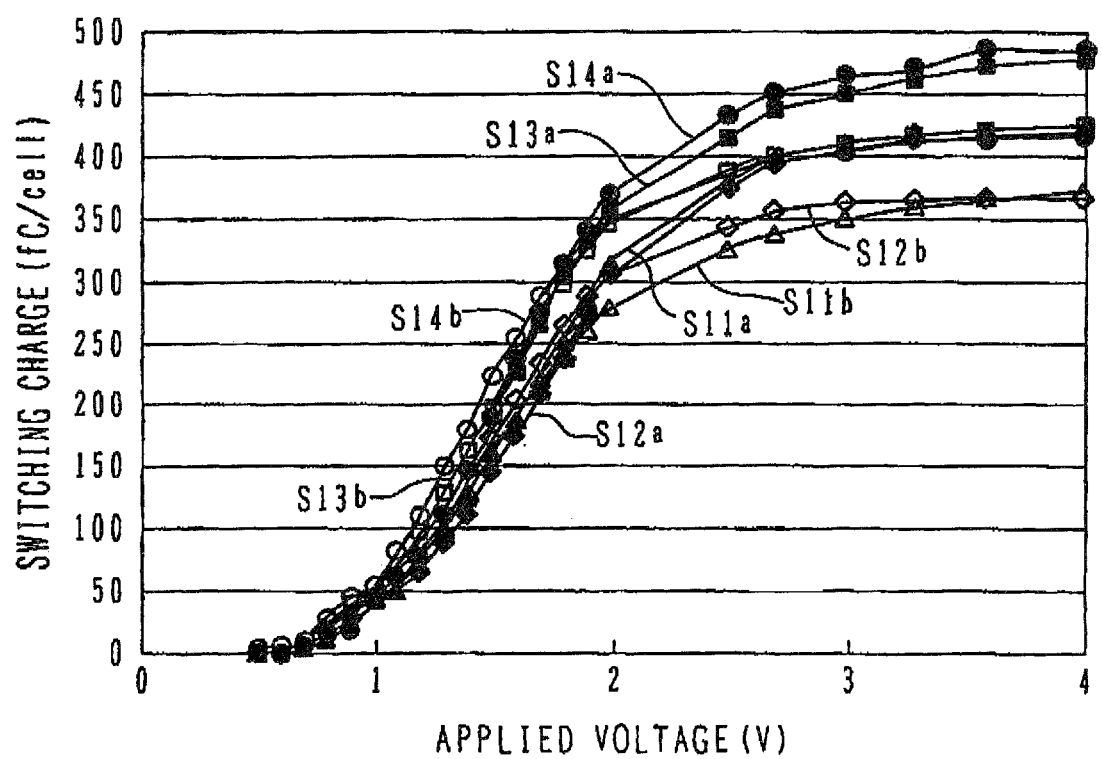

FIG. 3J is a graph showing a switching charge quantity of each sample upon application of voltage. In a low voltage range, a rise is fast for Ti film/alumina film lamination samples S13b and S14b with a thinned PZT film of 120 nm. In a high voltage range, a saturated switching charge quantity is large for samples S13a and S14a having a lamination of a Ti film and an alumina film under a Pt lower electrode and a PZT film thickness of 150 nm. In order to obtain a large switching charge quantity, it is preferable to adopt the structure that a lamination of a Ti film and an alumina film is formed under the Pt lower electrode.

Figure 3K:
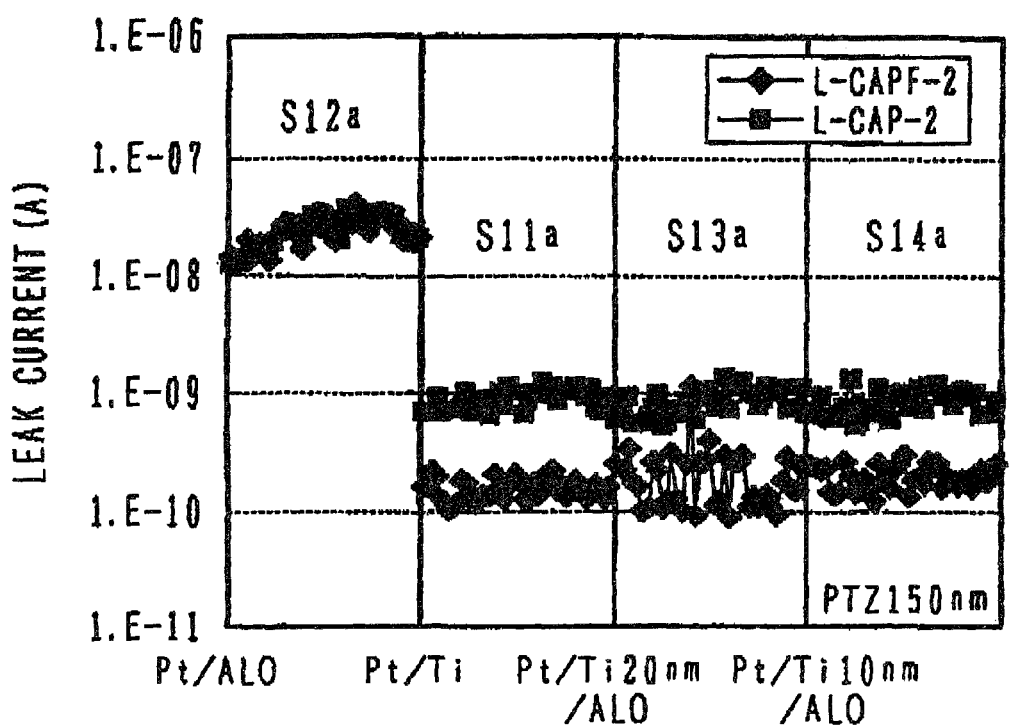
Figure 3L:
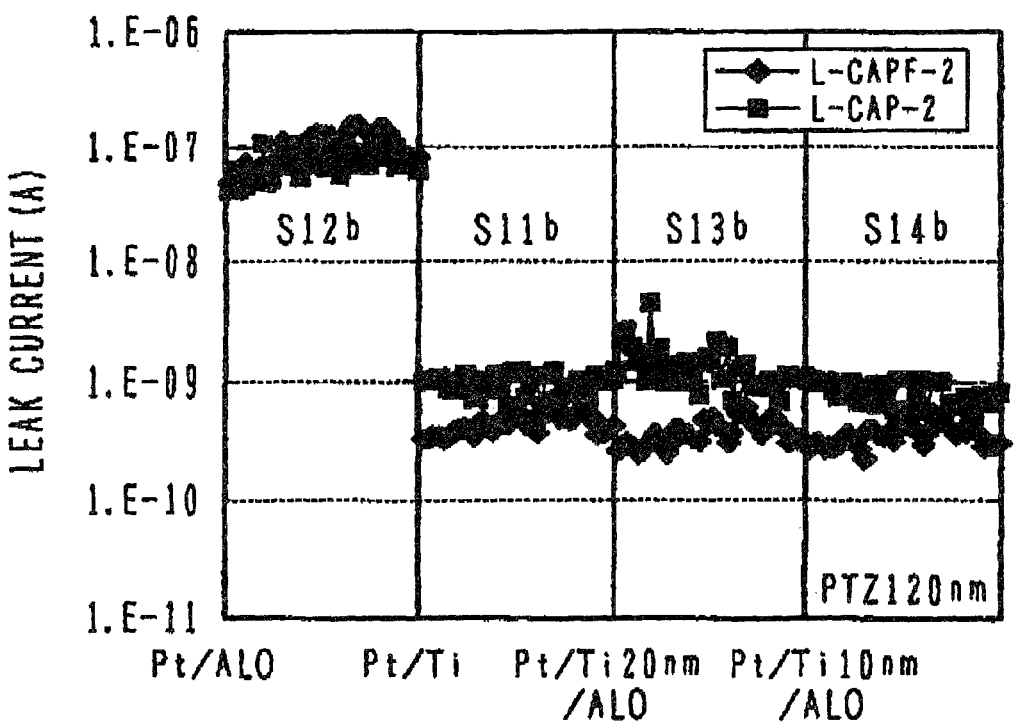

FIGS. 3K and 3L show measurement values of leak current of each sample having a PZT film thickness of 150 nm and 120 nm. The abscissa indicates each sample similar to that in FIGS. 3H and 3I, and the ordinate represents a leak current in the unit of A. The sample S12 using the AlO film as the adhesion enhancing film without the Ti film has quite a large leak current. It can be considered that a leak current increases greatly if the Ti film is not formed under the Pt lower electrode. If a TiO film is used as the adhesion enhancing film, not only the leak current is large, but also crystallinity of the lower electrode and ferro-electric film formed on the adhesion enhancing film is deteriorated, lowering a manufacture yield.

The leak current suggests existence of leak paths in the PZT film. It can be considered that a PZT film immediately after it is formed has excessive Pb and leak paths are formed. It can be estimated that if the Ti film exists under the Pt lower electrode and Pb atoms diffuse, the Ti film absorbs Pb atoms, and Ti atoms diffuse Into the PZT film to fill lattice defects. It can be considered that this phenomenon results in a small leak current of the sample having the Ti film under the Pt lower electrode.

If only the Ti film is formed under the Pt lower electrode, the process deterioration is large as indicated by the sample S11 shown in FIGS. 3F and 3G and FIGS. 3H and 3I. It can be estimated that hydrogen and moisture permeate from under the lower electrode and crystallinity of the ferro-electric film is deteriorated. It can be considered that if the alumina film is further disposed under the Ti film, moisture diffusion can be prevented and crystallinity of the ferro-electric film can be suppressed from being deteriorated.

The material of a conductive adhesion enhancing film capable of supplying Ti and absorbing excessive compositions of the ferro-electric film may be, in addition to Ti, Ti-containing TiN, TiAlN and TiAlON. The conductive adhesion enhancing film can be formed by physical deposition such as sputtering and electron beam deposition or by physical chemical deposition such as reactive sputtering.

The material of the insulating hydrogen diffusion preventive film capable of preventing diffusion of hydrogen and moisture is not limited only to alumina (aluminum oxide (AlO), but it is expected to be effective to use also aluminum nitride (AlN), titanium-aluminum nitride (TiAlN), tantalum oxide (TaO), titanium oxide (TiO) and zirconium oxide (ZrO). The insulating hydrogen diffusion preventive film can be formed by physical deposition such as sputtering, by chemical deposition such as CVD and by physical chemical deposition such as reactive sputtering.

FIGS. 1A to 1D illustrate a method for manufacturing the semiconductor device of the first embodiment of the present invention based on the above-described experiment results and show a manufactured semiconductor device.

Figure 1A:
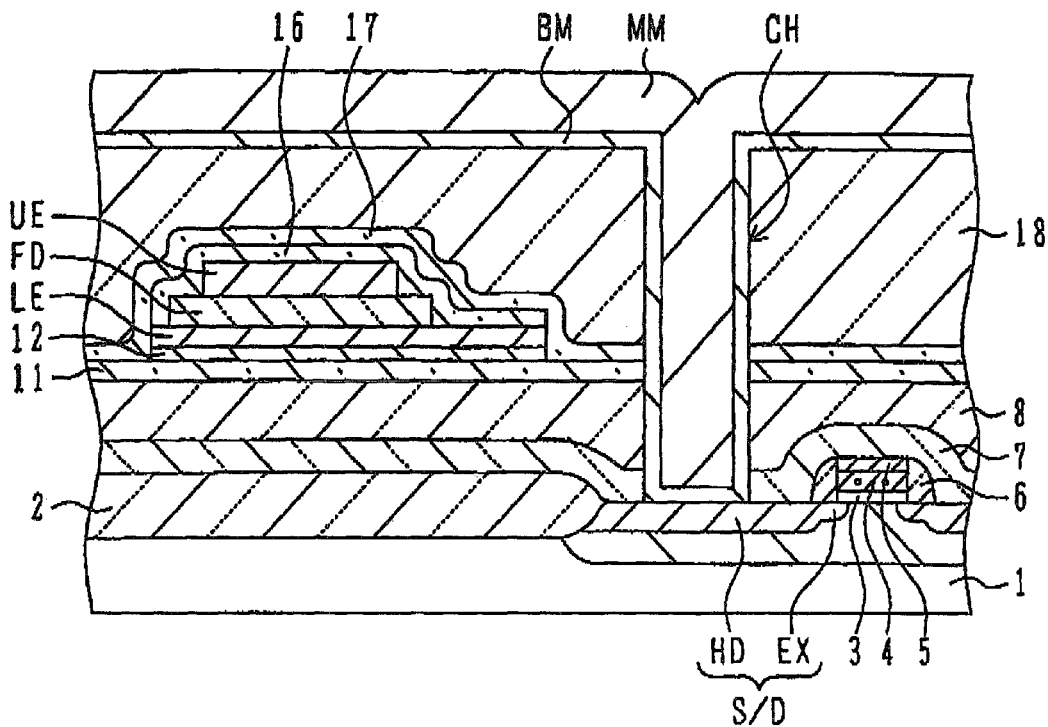
FIGS. 1A to 1D are cross sectional views of a semiconductor substrate illustrating a method for manufacturing a semiconductor device according to a first embodiment.

As shown in FIG. 1A, in the surface layer of a semiconductor substrate 1 such as a silicon substrate, an isolation region defining active regions is formed, for example, by local oxidation of silicon (LOCOS). A p-type well is formed in the region where an n-channel transistor is to be formed, and an n-type well is formed in the region where a p-type transistor is to be formed. Description will be made hereinafter on forming an n-channel transistor by way of example. For the p-channel transistor, conductivity types are reversed.

The surfaces of active regions are thermally oxidized to form a gate oxide film 3 having a thickness of, e.g., 10 nm. A polysilicon film 4 and a silicide layer 5 of $WSi_2$ are formed on the gate oxide film 3 and patterned to a gate electrode structure. By using as a mask the patterned gate electrode and a resist pattern formed when necessary, n-type ions are implanted at a low acceleration energy to form extensions EX of source/drain S/D. A silicon oxide film is deposited on the substrate, and anisotropically etched by reactive ion etching or the like to form side wall spacers 6 on side walls of the gate electrode.

By using the gate electrode formed with the side wall spacers and a resist pattern formed when necessary, as a mask, n-type ions are implanted at a high dose to form high concentration regions HD of the source/drain S/D. The silicide layer 5 on the polysilicon layer 4 may not be formed beforehand, and a metal film capable of silicide such as Co may be deposited at this stage and annealed to form a silicide layer.

An insulating oxygen barrier layer 7 of silicon oxynitride or the like having an oxygen diffusion preventive function is formed covering the MOS transistors formed in the manner described above. A silicon oxide film 8 is further deposited to a thickness of, e.g., about 700 nm by CVD using TEOS. If necessary, the surface of the silicon oxide film is planarized by chemical mechanical polishing (CMP) or the like. Annealing is performed for 30 minutes at 650° C. in a nitrogen atmosphere to degas the silicon oxide film 8. The above-described processes are well known processes of CMOS semiconductor device manufacture, and well known change, addition, modification and the like may be made.

On the silicon oxide film 8, an insulating hydrogen diffusion preventive film 11 of alumina or the like is deposited to a thickness of about 20 nm, for example, by sputtering. When considering workability, a thickness of the alumina film is preferably not thicker than 100 nm, and generally be in a range of 20 nm to 50 nm. When a dense film Is formed by CVD or the like, the film thickness may further be thinned. Also in this case, it is desired that a thickness of the insulating hydrogen diffusion preventive film is not thinner than 1 nm.

On the insulating hydrogen diffusion preventive film 11, a conductive adhesion enhancing film 12 of Ti or the like is deposited to a thickness of about 10 nm by sputtering at a substrate temperature of 150° C. A preferable temperature at which the Ti film is formed is in a range from 10° C. to 200° C. A thickness of the Ti film is preferably 1 to 25 nm. As the Ti film is made thick to 30 nm or more, crystalline orientation of a lower electrode and ferroelectric film to be formed on the Ti film will be degraded.

On the conductive adhesion enhancing film, a lower electrode of Pt or the like is deposited to a thickness of about 180 nm by sputtering. A substrate temperature is preferably in a range of 100° C. to 350° C. On the lower electrode, a ferroelectric film FD of PLZT ((Pb, La)(Zr, Ti)$O_3$ or the like is deposited in an amorphous state to a thickness of about 100 to 200 nm by RF sputtering. RTA is performed at a temperature not higher than 650° C. in an atmosphere containing Ar and $O_2$, and RTA is further performed at 750° C. in an oxygen atmosphere. With these annealing processes, the ferro-electric film FD is crystallized and the lower electrode LE is densified. Mutual diffusion of Pt and O is therefore suppressed at the interface between the lower electrode LE and ferro-electric film FD. Furthermore, excessive Pb in the ferro-electric film FD is diffused into the conductive adhesion enhancing film and Ti in the conductive adhesion enhancing film diffuses or intrudes up into the ferro-electric film, to stabilize the composition of the ferro-electric film.

An upper electrode UE is formed on the ferro-electric film FD. For example, while Ar and $O_2$ are flowed at a flow rate of about 100 sccm at a substrate temperature of about 300° C., a crystallized IrO film having a thickness of about 50 nm is formed by reactive sputtering. On the this IrO film, an IrO film is further formed to a thickness of about 200 nm by sputtering. The latter IrO film is not required to be crystallized when the film is formed.

The rear surface of the substrate is cleaned, and the upper electrode UE is patterned. Annealing is performed for 60 minutes at 650° C. in an $O_2$ atmosphere to recover damages occurred in the ferro-electric film. Thereafter, the ferro-electric film FD is patterned. A hydrogen diffusion preventive film 16 of alumina or the like is deposited by sputtering, covering the patterned, separated and divided ferro-electric film FD and upper electrode UE. Annealing is performed in an oxygen atmosphere and thereafter, the hydrogen diffusion preventive film 16 of alumina or the like and lower electrode LE are patterned at the same time. Annealing is performed in an oxygen atmosphere to tightly adhere the hydrogen diffusion preventive film.

The ferro-electric film FD is patterned in a shape retracting from the peripheral edge of the patterned lower electrode LE, whereas the upper electrode is patterned in a shape retracting from the peripheral edge of the ferro-electric film FD. The ferro-electric film FD is patterned to remain only on the lower electrode LE in a plan view, i.e. being encompassed in the lower electrode area and not protruding outside the lower electrode LE.

A hydrogen diffusion preventive film 17 of alumina or the like is further deposited on the whole substrate surface by sputtering, covering the ferro-electric capacitor formed in the manner described above, and annealing is performed in an oxygen atmosphere. Several annealing processes stabilize the composition of the ferro-electric film and suppress leak current.

An interlayer insulating film 18 of silicon oxide is deposited to a thickness of about 1.5 μm by high density plasma CVD, covering the ferro-electric capacitor, and the surface of the interlayer insulating film is planarized by CMP. Plasma annealing is performed by using $N_2O$ gas to slightly nitrify the interlayer insulating film. A moisture shielding function is therefore provided. The plasma process may be performed in gas containing either N or O, in place of $N_2O$.

A resist pattern is formed on the interlayer insulating film 18, and contact holes CH are formed by etching through the interlayer insulating film 18, hydrogen diffusion preventive films 17 and 11, silicon oxide film 8, and silicon oxynitride film 7, reaching the source/drain region S/D. A Ti film and a TiN film are deposited by sputtering to form a barrier metal film BM, and thereafter a main conductive film MM of a blanket W film is deposited by CVD.

Figure 1B:
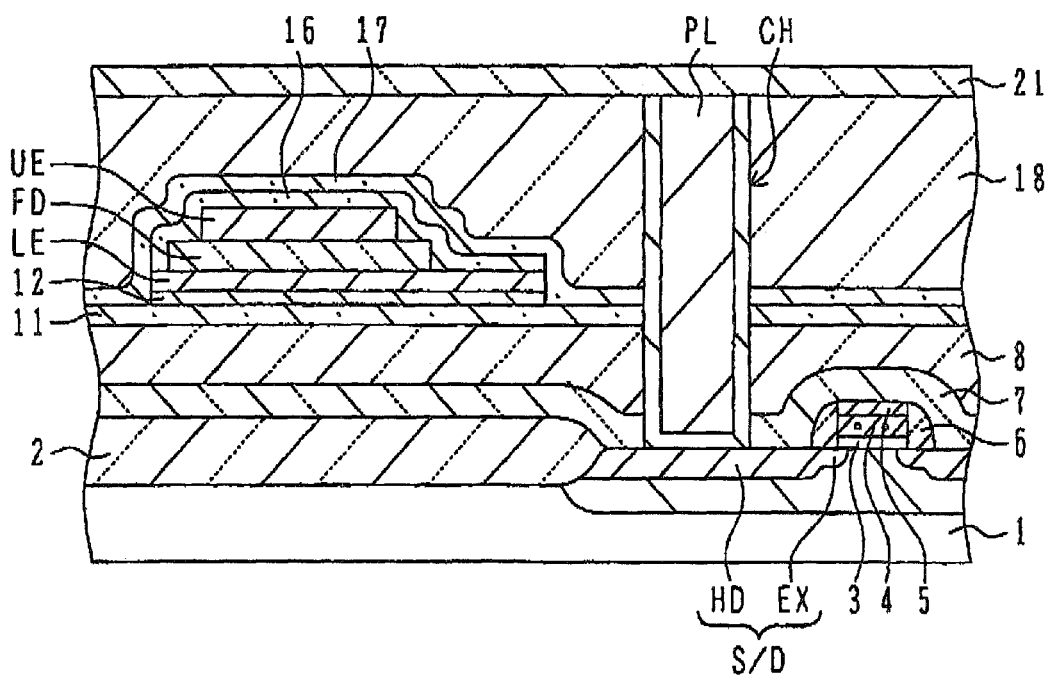

As shown in FIG. 1B, unnecessary conductive film on the interlayer insulating film 18 is removed to form W plugs PL flush with the surface of the interlayer insulating film 18. A silicon oxynitride film 21 is deposited on the interlayer insulating film 18 by plasma enhanced (PE) CVD, covering the plug PL, to thereby form an oxidation preventive film for the W plug PL.

Figure 1C:
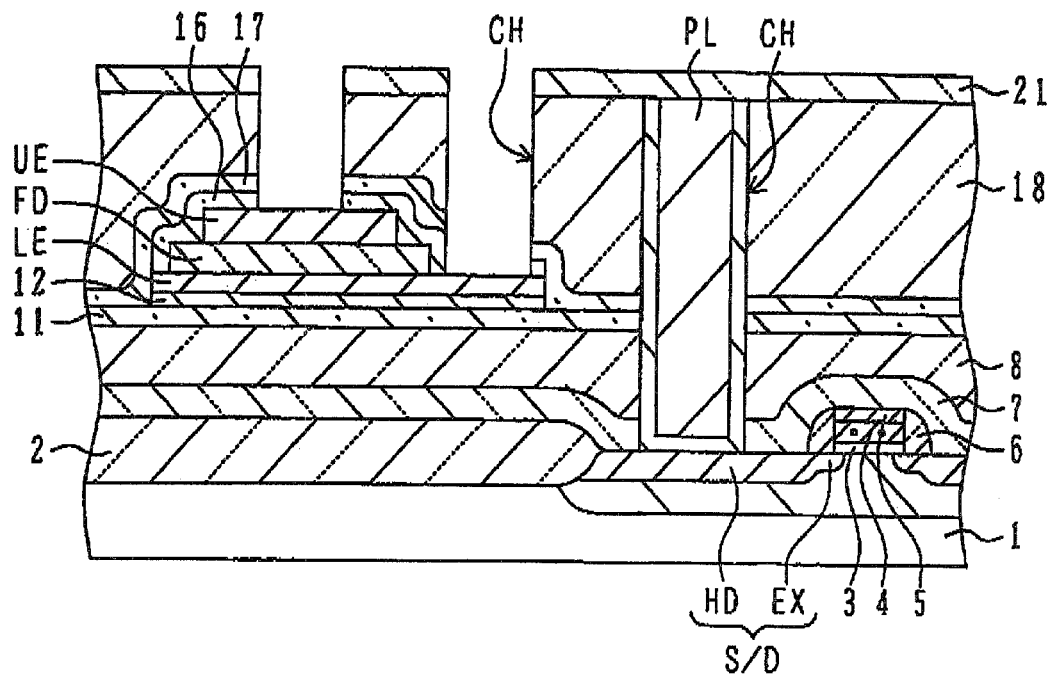

As shown in FIG. 1C, a resist pattern is formed on the silicon oxynitride film 21, and contact holes CH are formed by etching through the silicon oxynitride film 21, interlayer insulating film 18 and hydrogen diffusion preventive films 17 and 16, reaching the upper electrode UE and lower electrode LE. Annealing is performed in an oxygen atmosphere to recover damages.

Figure 1D:
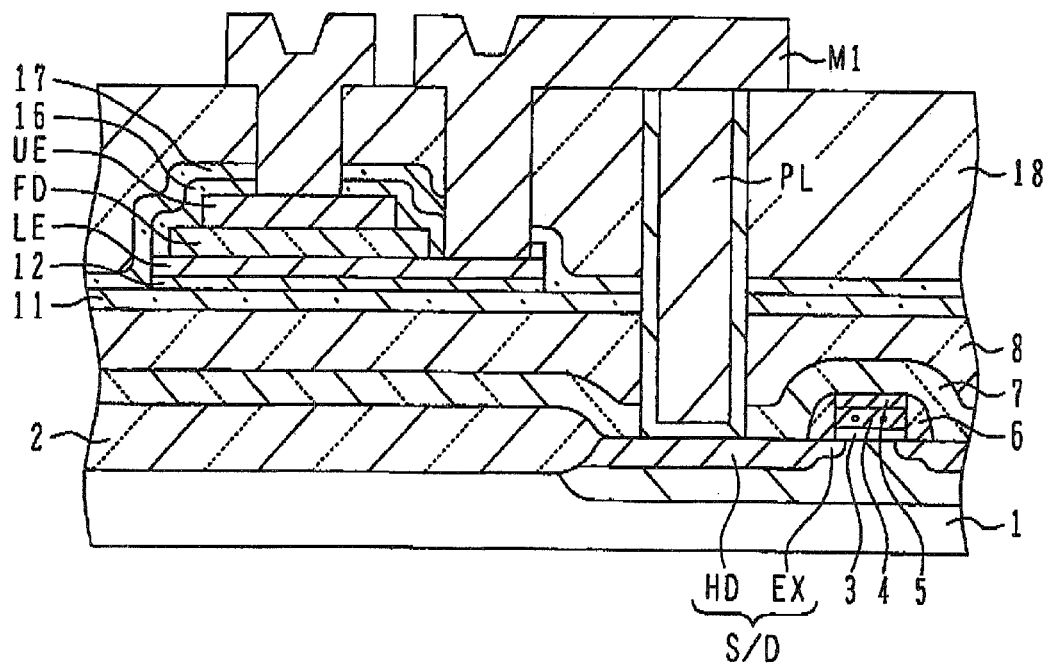

As shown in FIG. 1D, the resist pattern is removed, and the silicon oxynitride film 21 is removed by etch-back to expose the surfaces of the W plug PL. A wiring layer of aluminum or aluminum alloy is formed burying the contact holes, and etched by using a resist pattern as a mask to form metal wirings M1. In the structure shown, a memory cell is formed by connecting one of the source/drain regions S/D and the lower electrode LE of the ferro-electric capacitor. Further interlayer insulating films and wirings may be formed according to necessity.

According to this embodiment, the conductive adhesion enhancing film of Ti or the like is disposed under the lower electrode LE, and the insulating hydrogen diffusion preventive film of alumina or the like is disposed under the conductive adhesion enhancing film. Since not only the upper surface and side walls of the ferro-electric capacitor are covered with the upper insulating hydrogen diffusion preventive film but also the bottom surface of the capacitor is also covered with the lower insulating hydrogen diffusion preventive film, there is no path along which hydrogen and/or moisture can permeate, and the process deterioration and environmental influence are hard to occur. Since the conductive adhesion enhancing film is disposed on the lower insulating hydrogen diffusion preventive film, leak current can be suppressed. Even for a micro structure, an excessive reduction in switching charges can be suppressed, and the invertible charge quantity can be improved. It is possible to lower a coercive voltage or coercive field and improve durability against fatigue and imprint.

Figure 4:
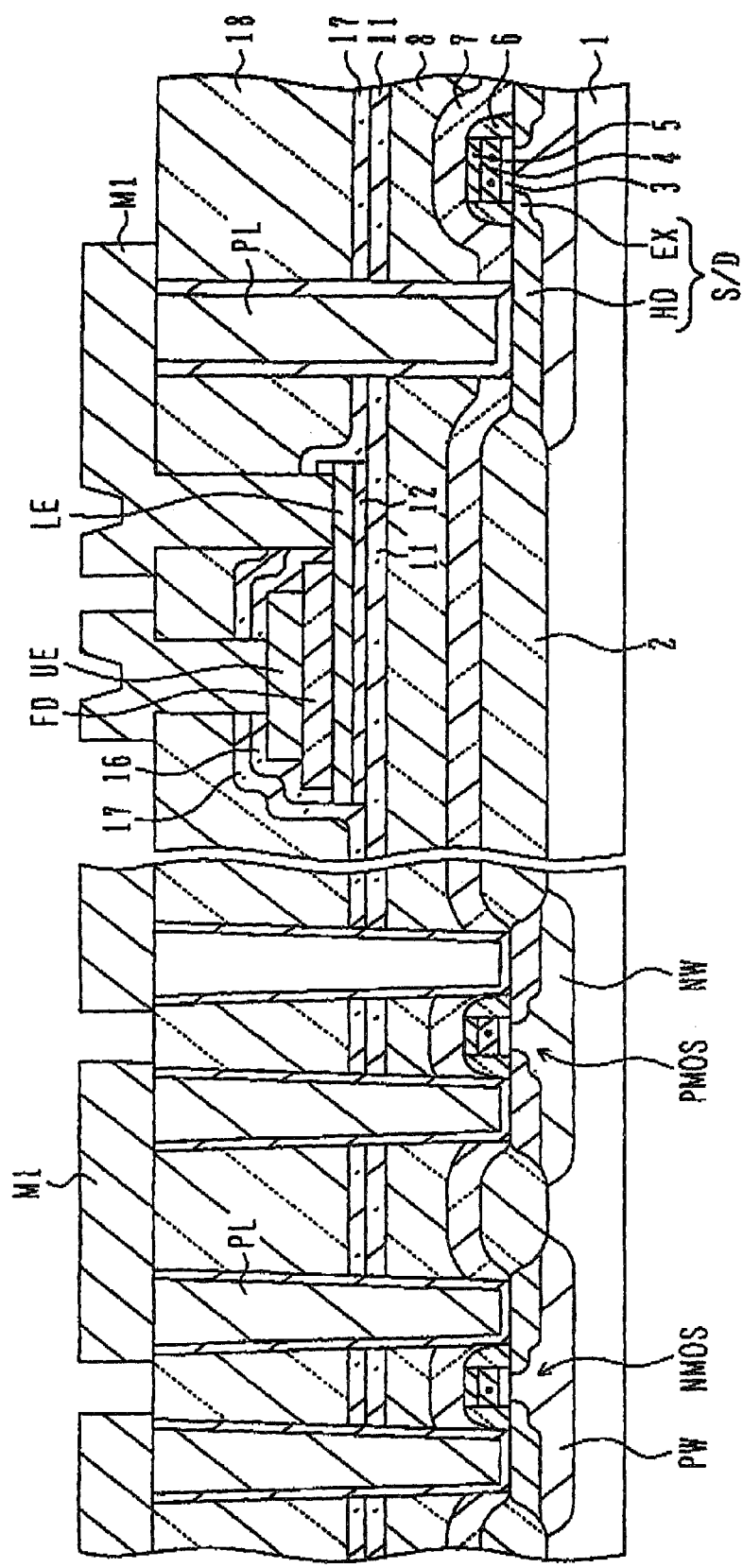
FIG. 4 is a cross sectional view showing a modification of the first embodiment.

FIG. 4 shows an integrated CMOS circuit according to a modification of the first embodiment. A CMOS logic circuit together with a transfer transistor of a memory cell are formed. The right side of FIG. 4 shows a ferroelectric memory structure similar to that shown in FIG. 1D. The left side of FIG. 4 shows the CMOS logic circuit. In active regions defined by an isolation region, a p-type well PW and an n-type well NW are formed. In the p-type well PW, an n-channel transistor NMOS is formed. In the n-type well NW, a p-channel transistor PMOS of an opposite conductivity type is formed. The transistors are covered with the silicon oxynitride film 7 and silicon oxide film 8, and the lower insulating hydrogen diffusion preventive film 11 and conductive adhesion enhancing film 12 are formed on the silicon oxide film.

A Pt lower electrode LE is formed on the conductive adhesion enhancing film 12, and a PZT ferro-electric film FD having a thickness of 120 nm is formed on the lower electrode LE. A Pt upper electrode UE is formed on the ferro-electric film FD, and the insulating hydrogen diffusion preventive film 17 and interlayer insulating film 18 are deposited on the whole substrate surface.

Contact holes for source/drain of a transfer transistor and contact holes for CMOS transistors are formed at the same time, and W plugs are buried in the contact holes. An inverter is connected by a first metal wiring.

Samples of an integrated CMOS circuit were formed. The insulating hydrogen diffusion preventive film 11 was formed by an alumina film having a thickness of 20 nm, the conductive adhesion enhancing film 12 was made of Ti, and two types of the conductive adhesion enhancing films were formed having thicknesses of 20 nm and 10 nm. A sample having a Ti layer of 20 nm thick is called a sample S23, and a sample having a Ti layer of 10 nm is called a sample S24. Measurement values are shown in FIGS. 5A to 5E.

Figure 5A:
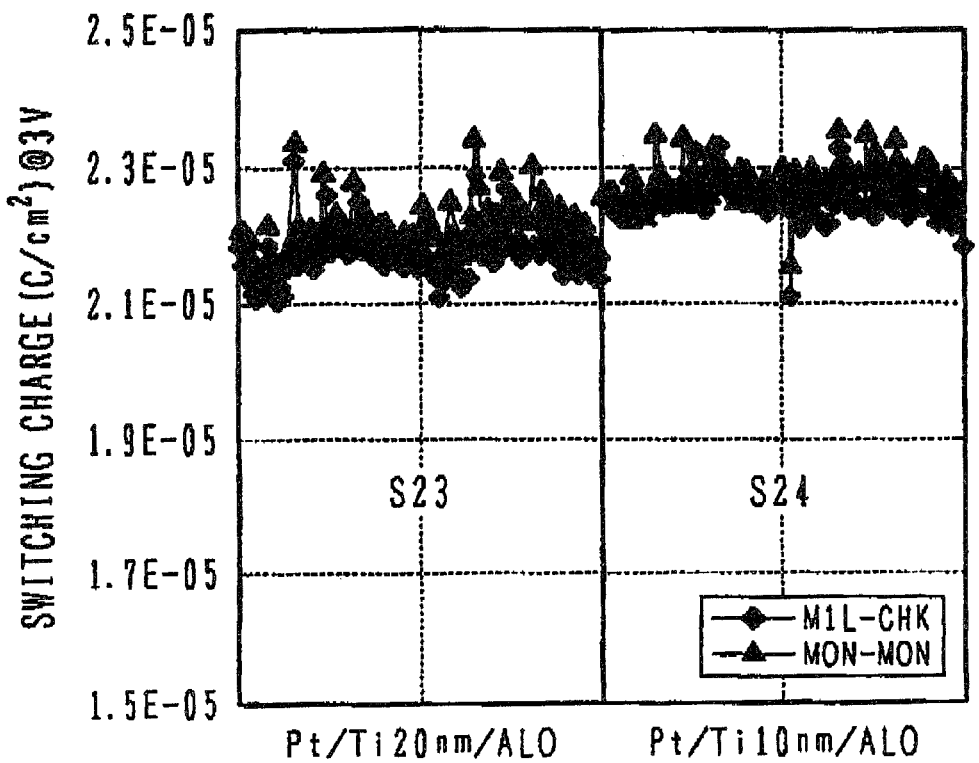
FIGS. 5A to 5E are graphs showing measurement results of samples of the modification.
Figure 5B:
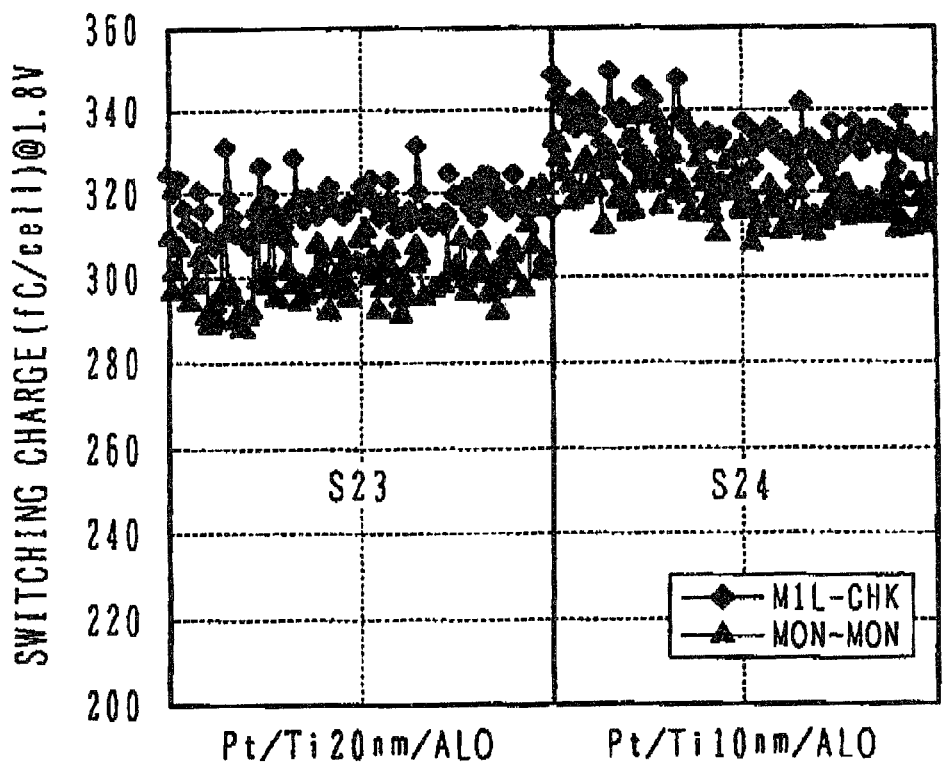
Figure 5C:
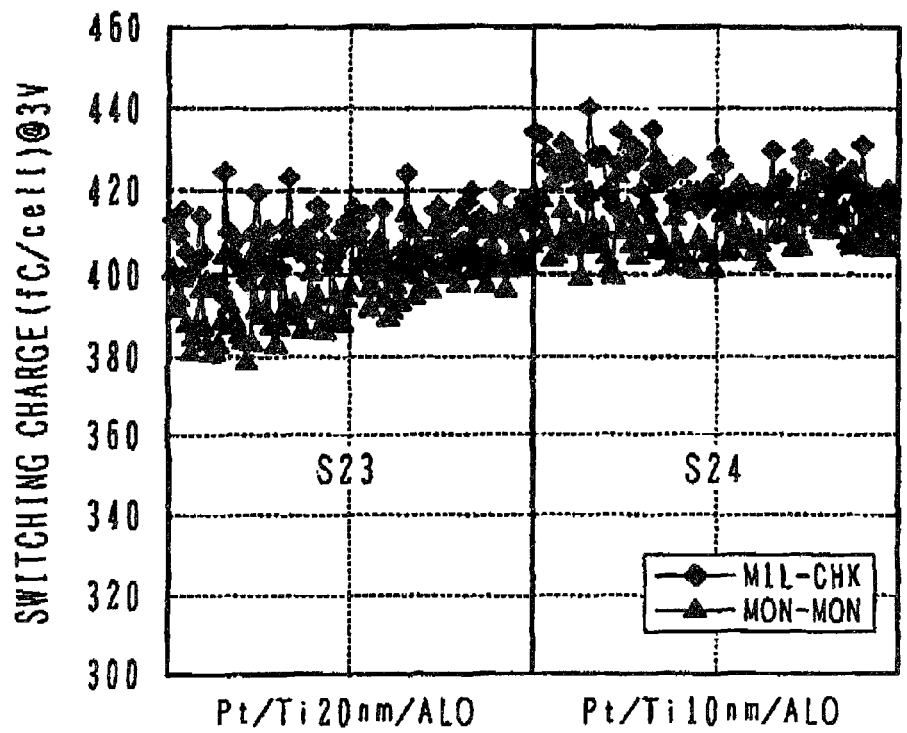
Figure 5D:
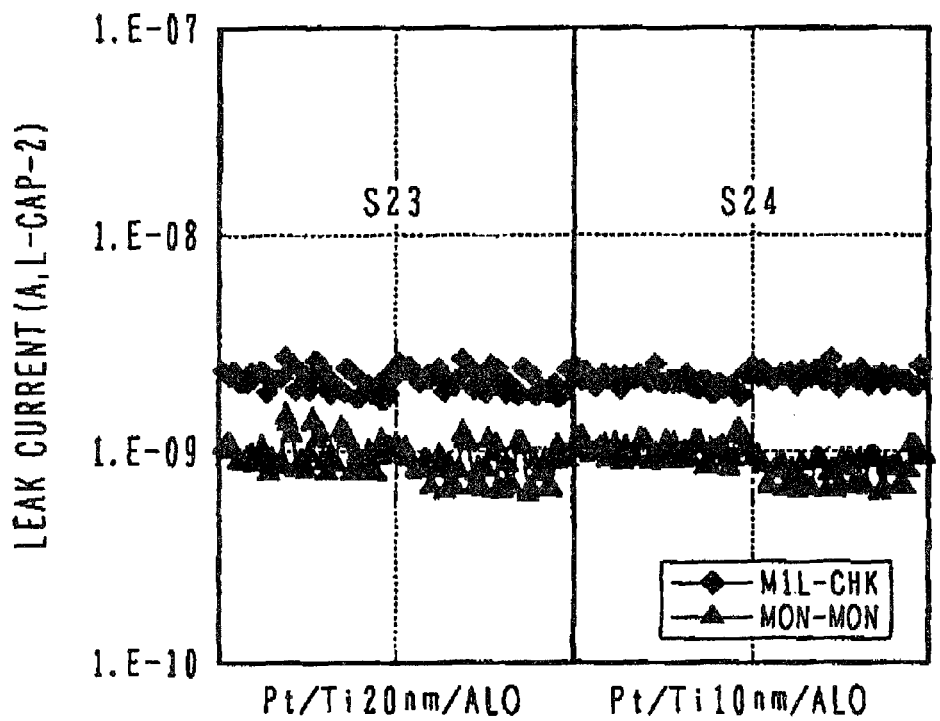
Figure 5E:
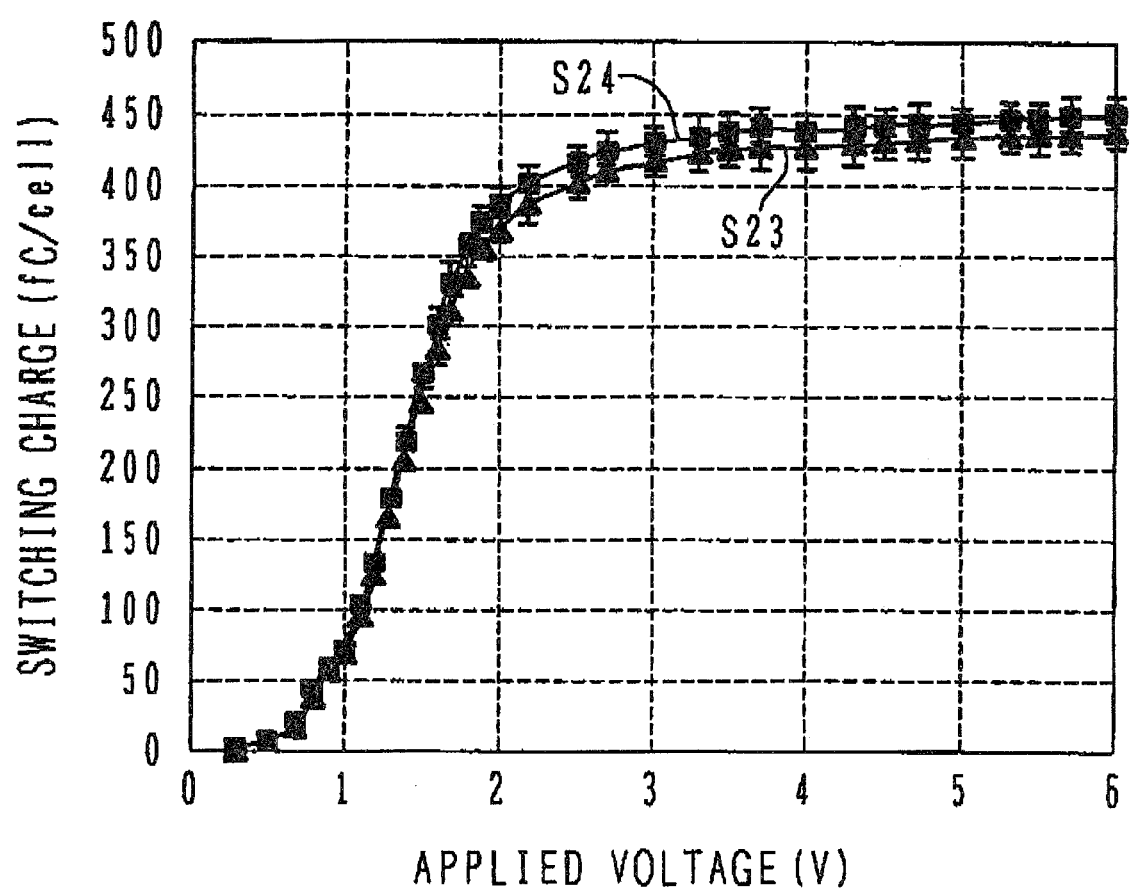

FIG. 5A shows a switching charge quantity of samples having a capacitor area of 50 μm×50 μm upon application of 3 V. FIGS. 5B and 5C show measurement values of a switching charge quantity of capacitor cell arrays upon application of 3 V and 1.8 V. FIG. 5D shows measurement values of leak current of the cell arrays. In FIGS. 5A to 5D, a measurement value of the sample formed up to the first layer metal wirings is indicated by a rhomb, and a measurement value of the sample formed up to the third layer metal wirings is indicated by a triangle. FIG. 5E shows a change in a switching charge quantity with an applied voltage.

As shown in FIG. 5A, the capacitor having an area of 50 μm×50 μm is scarcely deteriorated by multilayer wirings. As shown in FIGS. 5B and 5C, although the switching charge quantity lowers slightly from first layer metal wiring formation to third layer metal wiring formation, it can be said that the switching charge quantity is almost at the same level. As shown in FIG. 5E, at a Ti conductive adhesion enhancing film thickness of 10 nm, a rise of $Q_{SW}$ is fast, and a switching charge quantity at a low voltage becomes large. As shown in FIG. 5D, a leak current of the cell capacitor reduces with wiring formation independently from a Ti film thickness. It may be said that a leak current hardly increases when considering the annealing effects. The advantages were observed in a low resistance voltage, an improved $Q_{SW}$, a low leak current and suppression of the process deterioration.

A yield of 80% was obtained for the sample having a Ti film thickness of 20 nm. A yield of 83% was obtained for the sample having a Ti film thickness of 10 nm. It can be considered that improvement of crystallinity can be expected from a reduction in a Ti film thickness, being reflected upon a yield.

Description has been made on forming a planar type ferro-electric capacitor on an insulating film. A stack type is also possible, wherein a ferro-electric capacitor is formed on a conductive plug. In the following, with reference to FIGS. 6A to 6F, description will be made on the second embodiment in which a stack type ferro-electric capacitor is formed.

Figure 6A:
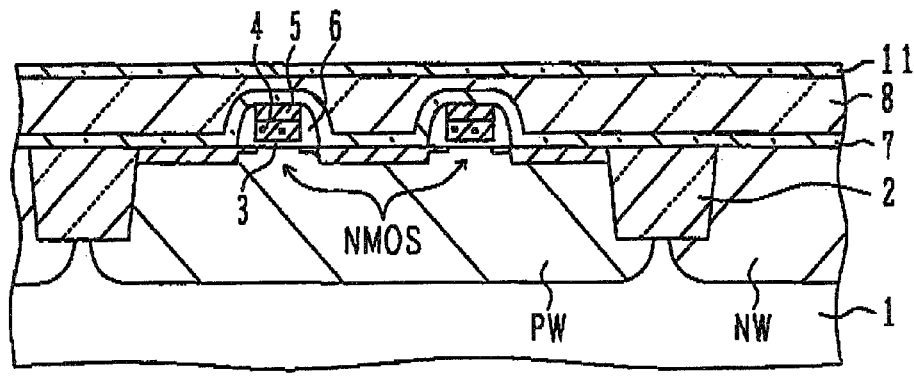
FIGS. 6A to 6F are cross sectional views of a semiconductor substrate illustrating a method for manufacturing a semiconductor device according to a second embodiment.

As shown in FIG. 6A, an isolation region 2 is formed in the surface layer of a semiconductor substrate 1 such as a silicon substrate by shallow trench isolation (STI) or the like. Ions are implanted to from a p-type well PW and an n-type well NW.

MOS transistor structures are formed by processes similar to those of the first embodiment. Namely, a gate oxide film 3 is formed by thermally oxidizing the active region surfaces, and a polysilicon film 4 and a silicide film 5 are formed and patterned to form gate electrodes. An n-type gate electrode is formed above the p-type well, and a p-type gate electrode is formed above the n-type well. Impurity ions of n-type are implanted into the p-type well to form extensions of n-type source/drain. Impurity ions of p-type are implanted into the n-type well. An insulating film such as silicon oxide is deposited, and anisotropic etching is performed to form side wall spacers 6. High concentration source/drain regions are formed by implanting n-type impurity ions into the p-type well and p-type impurity ions into the n-type well, respectively at a high concentration.

These processes are well known CMOS manufacture processes, and other well known processes may also be used. Two NMOSs shown have a central source/drain region as a common region for both NMOSs.

A silicon oxynitride film 7 having a thickness of 200 nm is deposited by CVD, covering the MOS transistors. A silicon oxide film 8 having a thickness of 1000 nm is deposited on the silicon oxynitride film by CVD, and planarized by CMP. Annealing is performed for 30 minutes at 650° C. in a nitrogen atmosphere to degas. An insulating hydrogen diffusion preventive film 11 of aluminum oxide having a thickness of about 50 nm is formed on the silicon oxide film 8 by sputtering. Instead of aluminum oxide, the insulating hydrogen diffusion preventive film 11 may be made of aluminum nitride, TiAlN, tantalum oxide, titanium oxide or zirconium oxide.

Figure 6B:
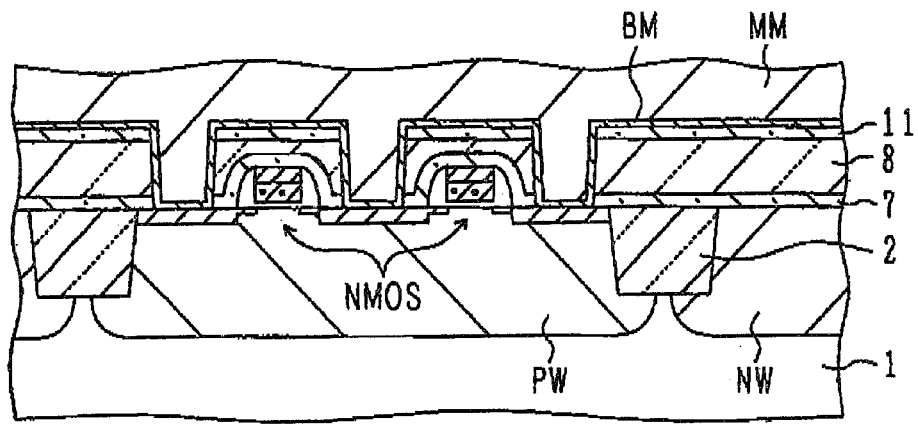

As shown in FIG. 6B, a resist pattern is formed on the insulating hydrogen diffusion preventive film 11, and contact holes CH are formed by etching reaching the source/drain regions of the MOS transistors. The central source/drain region will be connected to a bit line, and outer source/drain regions will be connected to capacitors. Annealing is performed for 30 minutes at 650° C. in a nitrogen atmosphere. A Ti layer of 20 nm thick, a TiN layer of 50 nm thick and a Ti layer of 20 nm thick are formed by sputtering to form a barrier layer BM serving also as an adhesion enhancing layer. On the barrier film BM, a W film is formed to a thickness of 300 nm by CVD to bury the contact holes CH.

Figure 6C:
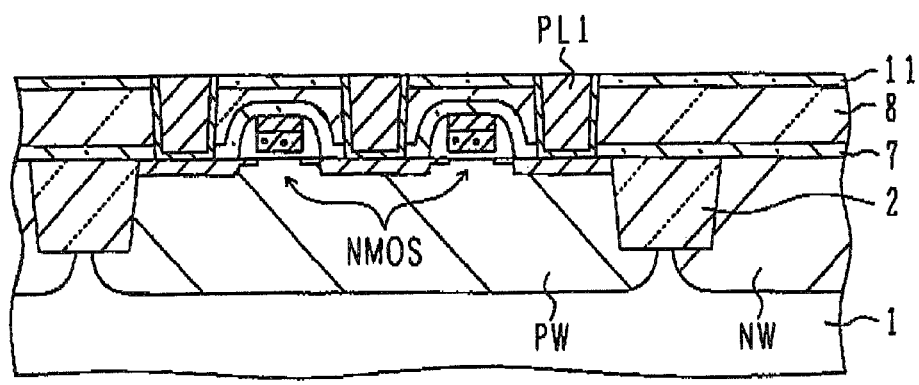

As shown in FIG. 6C, the conductive layer on the insulting hydrogen diffusion preventive film 11 is removed by low pressure polishing (CMP) or electrolytic mechanical polishing (ECMP), and conductive plugs PL1 are left in the contact holes. By using the low pressure polishing CMP or electrolytic mechanical polishing ECMP and the aluminum oxide film as a stopper, the W plug surface having good flatness is obtained which is at the same level as that of the surrounding insulating film surface.

Figure 6D:
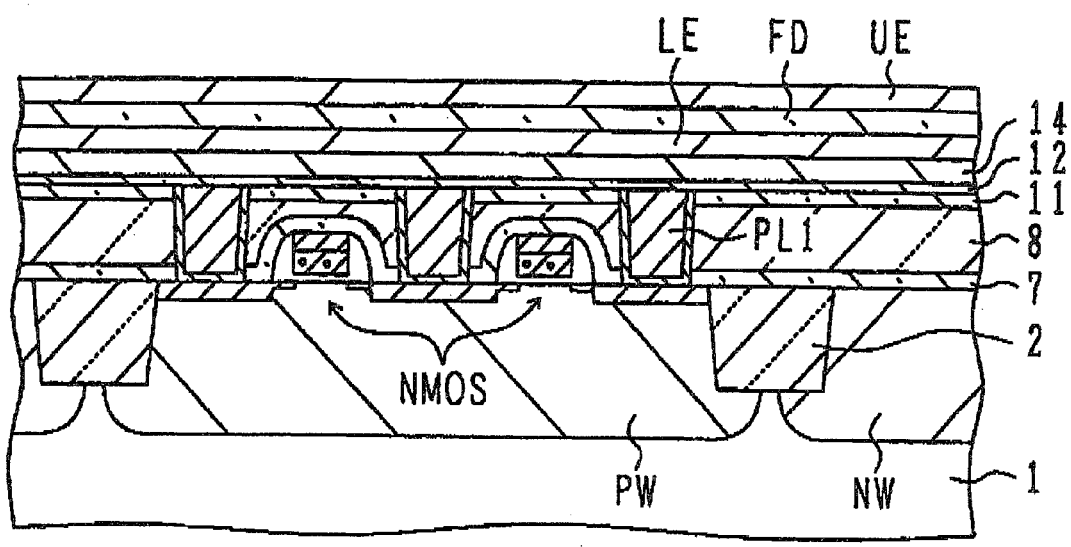

As shown in FIG. 6D, a conductive adhesion enhancing film 12 of a Ti film not thicker than 25 nm, a conductive oxygen barrier film 14 and a lower electrode LE are formed on the aluminum oxide film 11, covering the W plugs PL1. Since the underlying layer is flat, a film of good crystallinity can be formed. For example, the conductive oxygen barrier film 14 is a film made of noble metal Ir, Ru or TiAlN having a thickness of 100 to 200 nm. By forming the oxygen barrier film, it becomes possible to prevent oxygen from diffusing into the W plugs during formation of the ferro-electric film or during crystallization annealing. Instead of the Ti film, a TiN film, a TiAlN film or a TiAlON film may also be used as the conductive adhesion enhancing film. The lower electrode LE is made of a Pt film having a thickness of about 50 to 200 nm. The lower electrodes may be made of material selected from a group consisting of Pt, Ir, Ru, Rh, Re, Os, Pd, oxide thereof, and $SrRuO_3$.

A ferro-electric film FD of a PZT film of 120 nm thick is formed on the lower electrode LE by MOCVD. For example, MOCVD is performed at a film forming temperature of 650° C. and an oxygen partial pressure of 5 Torr, by using as a Pb source, Pb(DPM)2((DPM: di-pivaloylmethanate) at 0.32 ml/min, as a Zr source, tetrakis (dmhd: di-methylhexanedionate) at 0.3 ml/min, and as a Ti source, titanium-di-(iso-propoxy)-bis-(di-pivaloylmethanate)Ti(O-iPr) 2(DPM)2 (iPr: iso-propoxy) at 0.2 ml/min. The sources are dissolved in THF (tetrahydrofuran) at a mol ratio of 3%, and transported in a liquid state to a vaporizer. THF and sources were vaporized at a vaporizing temperature of 260° C., mixed with oxygen, and blown to a wafer via a shower head. A film formation time was set to 420 seconds. The composition of the PZT film obtained by MOCVD was Pb/(Zr+Ti)=1.15, Zr/(Zr+Ti)= 0.45.

Ferro-electric film material may be PZT, SBT and Bi-containing layered compound which contain a small amount of additive such as La, Ca, Sr and Si, and include PZT, BLT and PLZT expressed by a general formula of $ABO_3$.

After the ferro-electric film is formed, annealing is performed in an oxygen-containing atmosphere for crystallization. For example, an RTA process is performed including first annealing for 90 seconds at a substrate temperature of 600° C. in an atmosphere of mixture gas of Ar and $O_2$ and second annealing for 90 seconds at a substrate temperature of 750° C. in an oxygen atmosphere. These annealing processes do not influence the contact plugs. Noble metal becomes conductive oxide even if it is oxidized. Since the conductive oxygen barrier film exists under the lower electrode, oxygen diffusion can be prevented. An upper electrode UE is formed on the ferro-electric film FD by forming an iridium oxide film having a thickness of, e.g., 200 nm by sputtering. The upper electrode may be a single layer or a plurality of layers of at least one metal or metal oxide selected from a group consisting of Pt, Ir, Ru, Rh, Re, Os, Pd and $SrRuO_3$.

Figure 6E:
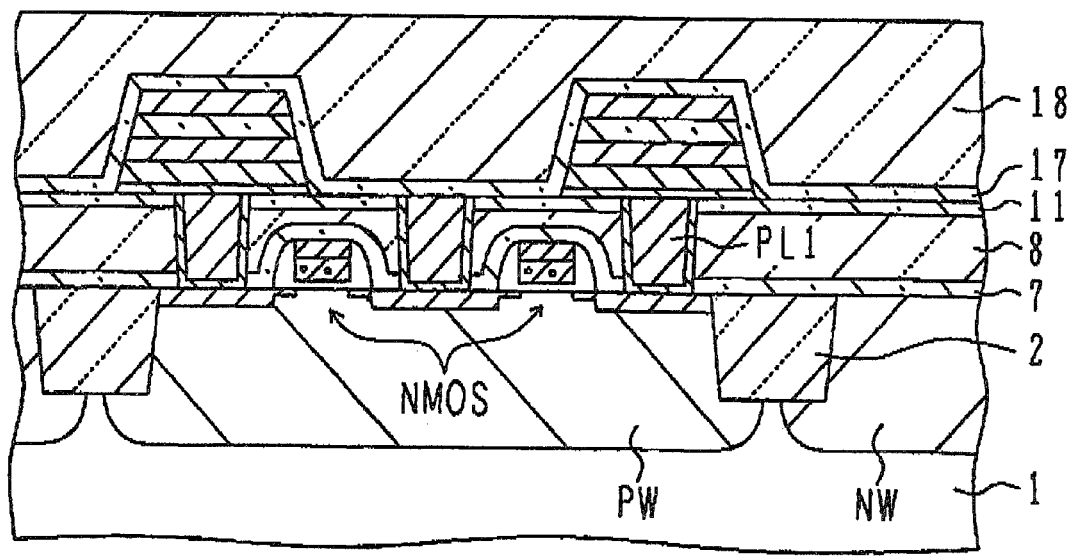

As shown in FIG. 6E, the upper electrode UE, ferro-electric film FD, lower electrode LE, conductive oxygen barrier film 14 and conductive adhesion enhancing film 12 are sequentially patterned by high temperature or room temperature etching by commonly using a hard mask. After etching, the hard mask is removed. Annealing is performed for one hour at 350° C. in an oxygen-containing atmosphere. An insulating hydrogen diffusion preventive film 17 of aluminum oxide or the like is formed to a thickness of 20 to 100 nm by sputtering or CVD, covering the ferro-electric capacitor. Damage recovering annealing is performed at 550° C. to 650° C. in an oxygen-containing atmosphere. Thereafter, an interlayer insulating film 18 is formed and its surface is planarized by CMP.

Figure 6F:
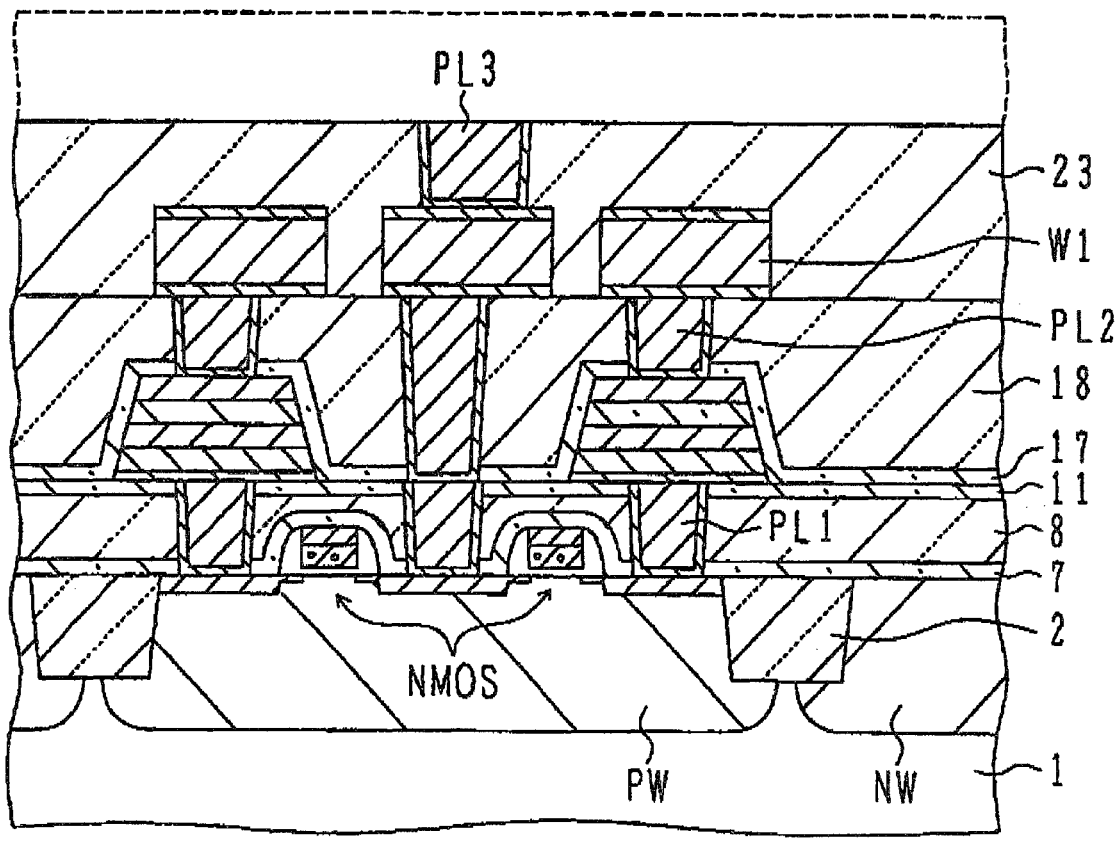

As shown in FIG. 6F, contact holes are formed by etching, reaching the central W plug PL1 and the upper electrode of the ferro-electric capacitor, and W plugs PL2 buying the contact holes are formed by processes similar to those for PL1. Similar processes are repeated to form multilayer wirings of a desired number of layers.

According to the embodiment, the ferro-electric capacitor is formed on the insulating film burying therein the conductive plugs. Since the underlying surface is highly planarized, it is possible to form the lower electrode and ferro-electric film without degrading crystallinity. Since the conductive adhesion enhancing film and insulating hydrogen diffusion preventive film are formed under the lower electrode, the advantages similar to the first embodiment can be expected. Since the conductive oxygen barrier layer is disposed under the lower electrode, it is possible to prevent oxygen from reaching the conductive plugs during the ferro-electric film forming process.

Since a lamination of the conductive adhesion enhancing film and insulating hydrogen diffusion preventive film is disposed under the lower electrode of the ferro-electric capacitor, durability against hydrogen and moisture can be increased so that a semiconductor device having a ferro-electric capacitor can be obtained which has small leak current and less process deterioration.

The present invention has been described in connection with the preferred embodiments. The invention is not limited only to the above embodiments. It will be apparent to those skilled in the art that other various modifications, improvements, combinations, and the like can be made.

What are claimed are:

1. A semiconductor device, comprising:
   a semiconductor substrate;
   a semiconductor element formed in said semiconductor substrate;
   an insulating film covering said semiconductor element and formed above said semiconductor substrate;
   a lower insulating hydrogen diffusion preventive film made of aluminum oxide, having a hydrogen/moisture shielding function, and formed above said insulating film;
   a conductive adhesion enhancing film made of at least one material selected from a group consisting of Ti, and TiN, formed on said lower insulating hydrogen diffusion preventive film;
   a ferro-electric capacitor including a lower electrode formed above said conductive adhesion enhancing film, a ferro-electric film formed on said lower electrode and being disposed within said lower electrode as viewed in plan, and an upper electrode formed on said ferro-electric film and being disposed within said ferro-electric film as viewed in plan,
   wherein said conductive adhesion enhancing film has a function of improving adhesion of said lower electrode of said ferro-electric capacitor and reducing leak current of said ferro-electric capacitor;
   a lower conductive plug including W, formed through said insulating film and said lower insulating hydrogen diffusion preventive film and electrically connecting said semiconductor element and said conductive adhesion enhancing film;
   a conductive oxygen barrier film made of TiAlN, and formed between said conductive adhesion enhancing film and said lower electrode;
   an interlayer insulating film covering said ferro-electric capacitor; and
   an upper conductive plug formed through said interlayer insulating film and reaching said upper electrode.

2. The semiconductor device according to claim 1, wherein said conductive adhesion enhancing film is made of a single Ti layer.

3. The semiconductor device according to claim 2, wherein a thickness of said conductive adhesion enhancing film is in a range of 1 to 25 nm.

4. The semiconductor device according to claim 1, wherein said conductive oxygen barrier film has a thickness of 100-200 nm.

5. The semiconductor device according to claim 1, wherein said lower insulating hydrogen diffusion preventive film has a thickness of 1 to 100 nm.

6. The semiconductor device according to claim 1, further comprising an upper insulating hydrogen diffusion preventive film formed covering an upper surface and side walls of said ferro-electric capacitor to envelope said ferro-electric capacitor together with said lower insulating hydrogen diffusion preventive film.

7. The semiconductor device according to claim 1, wherein said ferro-electric film is made of any one of PZT, PZT slightly doped with additive, BLT, SBT and Bi-containing layered compound.

8. The semiconductor device according to claim 1, wherein said lower electrode is an electrode made of at least one material selected from a group consisting of Pt, Ir, Ru, Rh, Re, Os, Pd, oxide thereof, and $SrRuO_3$.

* * * * *